(12) United States Patent
Park et al.

(10) Patent No.: US 8,111,768 B2
(45) Date of Patent: Feb. 7, 2012

(54) DIGITAL BROADCAST TRANSMITTER/RECEIVER HAVING AN IMPROVED RECEIVING PERFORMANCE AND SIGNAL PROCESSING METHOD THEREOF

(75) Inventors: Eui-jun Park, Seoul (KR); Yong-sik Kwon, Seoul (KR); Joon-soo Kim, Seoul (KR); Jung-pil Yu, Suwon-si (KR); Jin-hee Jeong, Anyang-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 79 days.

(21) Appl. No.: 12/262,809

(22) Filed: Oct. 31, 2008

(65) Prior Publication Data
US 2009/0106632 A1 Apr. 23, 2009

Related U.S. Application Data

(63) Continuation of application No. 11/475,098, filed on Jun. 27, 2006.

(60) Provisional application No. 60/739,430, filed on Nov. 25, 2005.

(51) Int. Cl.
*H04L 5/12* (2006.01)

(52) U.S. Cl. ...................................... 375/265

(58) Field of Classification Search .................. 375/265, 375/261, 262; 714/784, 792, 794, 795, 798
See application file for complete search history.

(56) References Cited

U.S. PATENT DOCUMENTS

| | | | |
|---|---|---|---|
| 6,687,310 B1 * | 2/2004 | Fimoff et al. | 375/265 |
| 6,810,084 B1 * | 10/2004 | Jun et al. | 375/240.28 |
| 6,980,603 B2 * | 12/2005 | Choi et al. | 375/295 |
| 2002/0001353 A1 * | 1/2002 | Citta et al. | 375/264 |

(Continued)

FOREIGN PATENT DOCUMENTS

KR 10-1997-010103 B1 6/1997
(Continued)

OTHER PUBLICATIONS

Lee et al. (ATSC Terrestrial Digital Television Broadcasting Using Single Frequency Networks, ETRI Journal, vol. 26, No. 2, Apr. 2004, pp. 92-100).*

(Continued)

*Primary Examiner* — Jaison Joseph
(74) *Attorney, Agent, or Firm* — Sughrue Mion, PLLC

(57) ABSTRACT

A digital broadcast transmitting/receiving system, and a signal processing method thereof, includes a randomizer for randomizing a transport stream into a specified position of which stuff bytes are inserted, a stuff-byte exchanger for replacing the stuff bytes included in data output from the randomizer with specified known data, an RS encoder for performing an RS-encoding of data output from the stuff-byte exchanger, an interleaver for interleaving data output from the RS encoder, a trellis encoder for performing a trellis encoding of data output from the interleaver, an RS parity generator for generating a parity by performing an RS encoding of data output from the RS encoder, and outputting the generated parity to the trellis encoder, and a modulator/RF converter for modulating data output from the trellis encoder and performing an RF up-converting of the modulated data. The digital broadcast receiving performance can be improved even in an inferior multi-path channel by detecting the known data from the received signal and using the known data for synchronization and equalization in a digital broadcast receiver.

16 Claims, 20 Drawing Sheets

U.S. PATENT DOCUMENTS

| | | | |
|---|---|---|---|
| 2002/0140867 A1* | 10/2002 | Weiss | 348/723 |
| 2002/0181581 A1* | 12/2002 | Birru et al. | 375/240.01 |
| 2002/0186762 A1* | 12/2002 | Xia et al. | 375/232 |
| 2002/0194570 A1* | 12/2002 | Birru et al. | 714/792 |
| 2003/0079173 A1* | 4/2003 | Birru | 714/792 |
| 2003/0099303 A1* | 5/2003 | Birru et al. | 375/265 |
| 2004/0148642 A1* | 7/2004 | Park et al. | 725/148 |
| 2005/0249301 A1* | 11/2005 | Jeong et al. | 375/265 |
| 2007/0033475 A1* | 2/2007 | Park et al. | 714/746 |
| 2009/0103658 A1 | 4/2009 | Jeong et al. | |
| 2009/0103661 A1 | 4/2009 | Jeong et al. | |
| 2009/0103662 A1 | 4/2009 | Jeong et al. | |
| 2009/0103663 A1 | 4/2009 | Jeong et al. | |
| 2009/0103664 A1 | 4/2009 | Jeong et al. | |
| 2009/0103665 A1 | 4/2009 | Jeong et al. | |

FOREIGN PATENT DOCUMENTS

| | | |
|---|---|---|
| KR | 10-2005-0107287 A | 11/2005 |
| KR | 2005-107286 | 11/2005 |
| WO | WO 02/085014 | 10/2002 |
| WO | WO 2005/071958 | 8/2005 |
| WO | WO 2005/109877 | 11/2005 |
| WO | WO 2005/109878 | 11/2005 |

OTHER PUBLICATIONS

Search Report and Written Opinion issued in International Application No. PCT/KR2006/004964 on Feb. 26, 2007.

Korean Office Action issued on May 22, 2007 in Korean Patent Application No. 2006-58203.

U.S. Appl. No. 11/475,098, filed Jun. 26, 2006, Eui-jun Park et al., Samsung Electronics Co., Ltd.

U.S. Appl. No. 12/262,728, filed Oct. 31, 2008, Eui-jun Park et al., Samsung Electronics Co., Ltd.

U.S. Appl. No. 12/262,773, filed Oct. 31, 2008, Eui-jun Park et al., Samsung Electronics Co., Ltd.

Canadian Office Action issued Aug. 12, 2011 in corresponding Canadian application No. 2686674.

Korean Office Action issued on Jul. 29, 2011 in corresponding Korean application No. 10-2009-0095724.

Korean Office Action issued on Jul. 29, 2011 in corresponding Korean application No. 10-2009-0118773.

Korean Office Action issued on Jul. 29, 2011 in corresponding Korean application No. 10-2009-0118775.

Korean Office Action issued on Jul. 29, 2011 in corresponding Korean application No. 10-2009-0118776.

Korean Office Action issued on Jul. 29, 2011 in corresponding Korean application No. 10-2009-0118777.

Korean Office Action issued on Jul. 29, 2011 in corresponding Korean application No. 10-2009-0118779.

* cited by examiner

FIG. 5A

MPEG TS PACKET INCLUDING ADAPTATION FIELD

| SYNC | Normal Header | AF Header | SRS | Normal Stream |
|---|---|---|---|---|
| 1 | 3 | 2 | N | 182-N |

FIG. 5B

| SYNC | Normal Header | AF Header | PCR or OPCR | SRS | Normal Stream |
|---|---|---|---|---|---|
| 1 | 3 | 2 | 6 | N-6 | 182-N |

FIG. 5C

| SYNC | Normal Header | AF Header | Private data | SRS | Normal Stream |
|---|---|---|---|---|---|
| 1 | 3 | 2 | 5 | N-5 | 182-N |

FIG. 5D

| SYNC | Normal Header | AF Header | Adaptation field extension | SRS | Normal Stream |
|---|---|---|---|---|---|
| 1 | 3 | 2 | 2 | N-2 | 182-N |

FIG. 5E

| SYNC | Normal Header | AF Header | Splice count | SRS | Normal Stream |
|------|---------------|-----------|--------------|-----|---------------|
| 1    | 3             | 2         | 1            | N-1 | 182-N         |

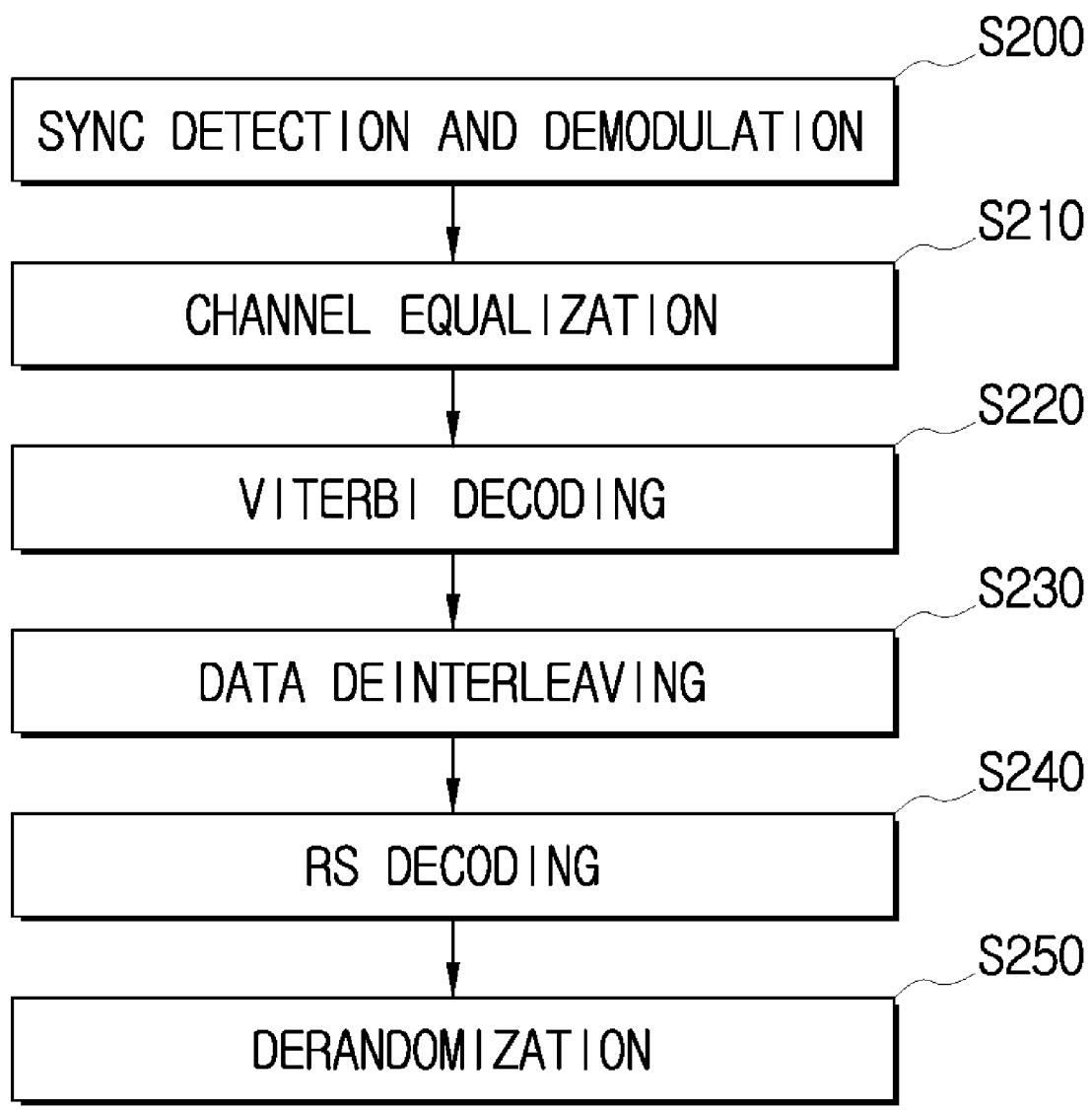

DIGITAL BROADCAST TRANSMITTER/RECEIVER HAVING AN IMPROVED RECEIVING PERFORMANCE AND SIGNAL PROCESSING METHOD THEREOF

CROSS-REFERENCE TO RELATED APPLICATIONS

This application is a continuation of U.S. patent application Ser. No. 11/475,098, filed Jun. 27, 2006, currently pending, which claims priority from U.S. Provisional Patent Application No. 60/739,430, filed on Nov. 25, 2005 in the United States Patent and Trademark Office, the disclosures of which are incorporated herein by reference.

BACKGROUND OF THE INVENTION

1. Field of the Invention

Aspects of the present invention relate to a digital broadcast transmitter/receiver and a signal processing method thereof, and more particularly to a digital broadcast transmitter/receiver and a signal processing method thereof which can improve the receiving performance of the system by inserting a known sequence (also referred to as a "supplementary reference sequence (SRS)") into a VSB (Vestigial Side Band) data stream and transmitting the data stream with the inserted known sequence.

2. Description of the Related Art

An ATSC (Advanced Television Systems Committee) VSB system that is an American-type digital terrestrial broadcasting system is a signal carrier type broadcasting system, and uses a field sync signal in the unit of 312 segments. FIG. 1 is a block diagram illustrating the construction of a transmitter/receiver of an ATSC DTV standard as a general American-type digital terrestrial broadcasting system.

The digital broadcast transmitter of FIG. 1 includes a randomizer 110 for randomizing Moving Picture Experts Group-2 (MPEG-2) transport stream (TS), and a Reed-Solomon (RS) encoder 120 for adding RS parity bytes to the transport stream in order to correct bit errors occurring due to the channel characteristic in a transport process. An interleaver 130 interleaves the RS-encoded data according to a specified pattern. A trellis encoder 140 maps the interleaved data onto 8-level symbols by performing a trellis encoding of the interleaved data at the rate of 2/3. The digital broadcast transmitter performs an error correction coding of the MPEG-2 transport stream.

The digital broadcast transmitter further includes a multiplexer 150 for inserting a segment sync signal and a field sync signal into the error-correction-coded data. A modulator/RF converter 160 inserts a pilot tone into the data symbols into which the segment sync signal and the field sync signal are inserted by inserting specified DC values into the data symbols, performs a VSB modulation of the data symbols by pulse-shaping the data symbols, and up-converts the modulated data symbols into an RF channel band signal to transmit the RF channel band signal. Accordingly, the digital broadcast transmitter randomizes the MPEG-2 transport stream, outer-codes the randomized data through the RS encoder 120 that is an outer coder, and distributes the coded data through the interleaver 130. Also, the digital broadcast transmitter inner-codes the interleaved data in the unit of 12 symbols through the trellis encoder 140, performs the mapping of the inner-coded data onto the 8-level symbols, inserts the field sync signal and the segment sync signal into the coded data, performs the VSB modulation of the data, and then up-converts the modulated data into the RF signal to output the RF signal.

Meanwhile, the digital broadcast receiver of FIG. 1 includes a tuner (not shown) for down-converting an RF signal received through a channel into a baseband signal, and a demodulator 210 for performing a sync detection and demodulation of the converted baseband signal. An equalizer 220 compensates for a channel distortion of the demodulated signal occurring due to a multi-path. A Viterbi decoder 230 corrects errors of the equalized signal and decodes the equalized signal to symbol data. A deinterleaver 250 rearranges the data distributed by the interleaver 130 of the digital broadcast transmitter. An RS decoder 250 corrects errors, and a derandomizer 260 de-randomizes the data corrected through the RS decoder 250 and outputs an MPEG-2 transport stream.

Accordingly, the digital broadcast receiver of FIG. 1 down-converts the RF signal into the baseband signal, demodulates and equalizes the converted signal, and then channel-decodes the demodulated signal to restore to the original signal.

FIG. 2 illustrates a VSB data frame for use in the American type digital broadcasting (8-VSB) system, into which a segment sync signal and a field sync signal are inserted. As shown in FIG. 2, one frame is composed of two fields. One field is composed of one field sync segment that is the first segment and 312 data segments. Also, one data segment in the VSB data frame corresponds to one MPEG-2 packet, and is composed of a segment sync signal of four symbols and 828 data symbols.

In FIG. 2, the segment sync signal and the field sync signal are used for the synchronization and equalization in the digital broadcast receiver. That is, the field sync signal and the segment sync signal refer to known data between the digital broadcast transmitter and receiver, which is used as a reference signal when the equalization is performed in the receiver side.

As shown in FIG. 1, the VSB system of the American type digital terrestrial broadcasting system is a single carrier system. Thus, the system has the drawback in that it is weak in a multi-path fading channel environment having the Doppler effect. Accordingly, the performance of the receiver is greatly influenced by the performance of the equalizer for removing the multi-path fading.

However, according to the existing transport frame as shown in FIG. 2, since the field sync signal that is the reference signal of the equalizer 220 appears once for every 313 segments, its frequency is quite low with respect to one frame signal, and this causes the performance of equalization to deteriorate. Specifically, it is not easy for the existing equalizer 220 to estimate the channel using a small amount of data as above and to equalize the received signal by removing the multi-path fading. Accordingly, the conventional digital broadcast receiver has the disadvantages that its receiving performance deteriorates in an inferior channel environment, and especially in a Doppler fading channel environment.

SUMMARY OF THE INVENTION

An aspect of the present invention is to provide a digital broadcast transmitter/receiver and a signal processing method thereof that can improve the receiving performance of the system by generating and transmitting a transport signal with known data added thereto in a transmitter side and by detecting the transport signal in a receiver side.

Additional aspects and/or advantages of the invention will be set forth in part in the description which follows and, in part, will be obvious from the description, or may be learned by practice of the invention.

According to an aspect of the present invention, a transmitter comprises a randomizer for randomizing a transport stream into a specified position of which stuff bytes are inserted, a stuff-byte exchanger for replacing the stuff bytes included in data output from the randomizer with specified known data, an RS encoder for performing an RS-encoding of data output from the stuff-byte exchanger, an interleaver for interleaving data output from the RS encoder, a trellis encoder for performing a trellis encoding of data output from the interleaver, an RS parity generator for generating a parity by performing an RS encoding of data output from the RS encoder, and outputting the generated parity to the trellis encoder, and a modulator/RF converter for modulating data output from the trellis encoder and performing an RF up-converting of the modulated data.

According to an aspect of the invention, the trellis encoder includes a memory for performing the trellis encoding, and performs a memory initialization with respect to data input in the position into which the stuff bytes are inserted.

According to an aspect of the invention, the trellis encoder outputs a value for initializing the memory to the RS parity generator, receives the parity generated by the RS parity generator, and replaces a corresponding parity by the received parity.

According to an aspect of the invention, the digital broadcast transmitter further includes a controller for generating a control signal that indicates information about the position into which the stuff bytes are inserted, and controlling the memory initialization of the trellis encoder.

According to an aspect of the invention, the controller transmits position information of the stuff bytes and the known data to be replaced in the corresponding position to the stuff-byte exchanger, and transmits position information of an initialization packet to the RS parity generator.

According to an aspect of the invention, the RS parity generator includes a packet buffer for temporarily storing a packet that includes an initialization area output from the RS encoder.

According to an aspect of the invention, the packet buffer receives and updates data changed according to the memory initialization.

According to an aspect of the invention, the RS parity generator further includes a byte mapper for mapping initialization symbols output from the trellis encoder with specified bytes, and outputting the mapped symbols to the packet buffer, an RS encoder for performing an RS encoding of data output from the packet buffer, and a symbol mapper for converting an output of the RS encoder into specified symbols.

According to an aspect of the invention, the stuff bytes are inserted into an adaptation field of the transport stream.

According to an aspect of the invention, the information about a position and a length of the stuff bytes is inserted in a specified position of the transport stream.

In another aspect of the present invention, there is provided a signal transmission method for a digital broadcast transmitter, which comprises randomizing a transport stream into a specified position of which stuff bytes are inserted, replacing the stuff bytes in the randomized data with specified known data, performing an RS-encoding of data having the replaced stuff bytes, interleaving the RS encoded data, performing a trellis encoding of the interleaved data, generating a parity by performing an RS encoding of the RS encoded data, and outputting the generated parity for use in the trellis encoding, and modulating the trellis encoded data and performing an RF up-converting of the modulated data.

In still another aspect of the present invention, there is provided a digital broadcast receiver, which comprises a demodulator for receiving and demodulating a signal encoded by inserting specified known data into stuff bytes inserted into a specified position, an equalizer for equalizing the demodulated signal, a Viterbi decoder for error-correcting and decoding the equalized signal, a deinterleaver for deinterleaving output data of the Viterbi decoder, and a derandomizer for performing a derandomization of output data of the deinterleaver.

In still another aspect of the present invention, there is provided a trellis encoder for a digital broadcast transmitter that transmits transport stream formed by replacing stuff bytes inserted into a specified position with specified known data, the trellis encoder comprising a memory for performing a trellis encoding, and performing a memory initialization with respect to data input in a position into which the stuff bytes are inserted.

In still another aspect of the present invention, there is provided a digital broadcast transmitter, which comprises a randomizer for randomizing a transport stream into a specified position of which stuff bytes are inserted, a stuff-byte exchanger for replacing the stuff bytes included in data output from the randomizer with specified known data, an RS encoder for performing an RS-encoding of data output from the stuff-byte exchanger, an interleaver for interleaving data output from the RS encoder, a trellis encoder, including a memory, for performing a memory initialization with respect to data input in a position into which the stuff bytes are inserted, and performing a trellis encoding of data output from the interleaver, an RS parity generator for receiving a value for initializing the memory, generating a parity, and outputting the generated parity to the trellis encoder, and a modulator/RF converter for modulating data output from the trellis encoder and performing an RF up-converting of the modulated data.

In still another aspect of the present invention, there is provided a signal processing method for a digital broadcast transmitter, which comprises randomizing a transport stream into a specified position of which stuff bytes are inserted, replacing the stuff bytes in data output in the randomization with specified known data, performing an RS-encoding of data output in the stuff-byte replacing, interleaving data output in the RS encoding, performing a trellis encoding of data output in the interleaving and performing a memory initialization with respect to data input in a position into which the stuff bytes are inserted, performing RS parity generation by receiving a value for initializing the memory, generating a parity, and outputting the generated parity for the trellis encoding, and modulating data output in the trellis encoding and performing an RF up-converting of the modulated data.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 5a to 5e are views illustrating diverse formats of an MPEG-2 transport stream packet that includes an adaptation field to which stuff bytes are added according to aspects of the present invention;

FIG. 19 is a flowchart provided to explain the operation of a digital broadcast receiver according to an embodiment of the present invention.

DETAILED DESCRIPTION OF THE EMBODIMENTS

Figure 1:
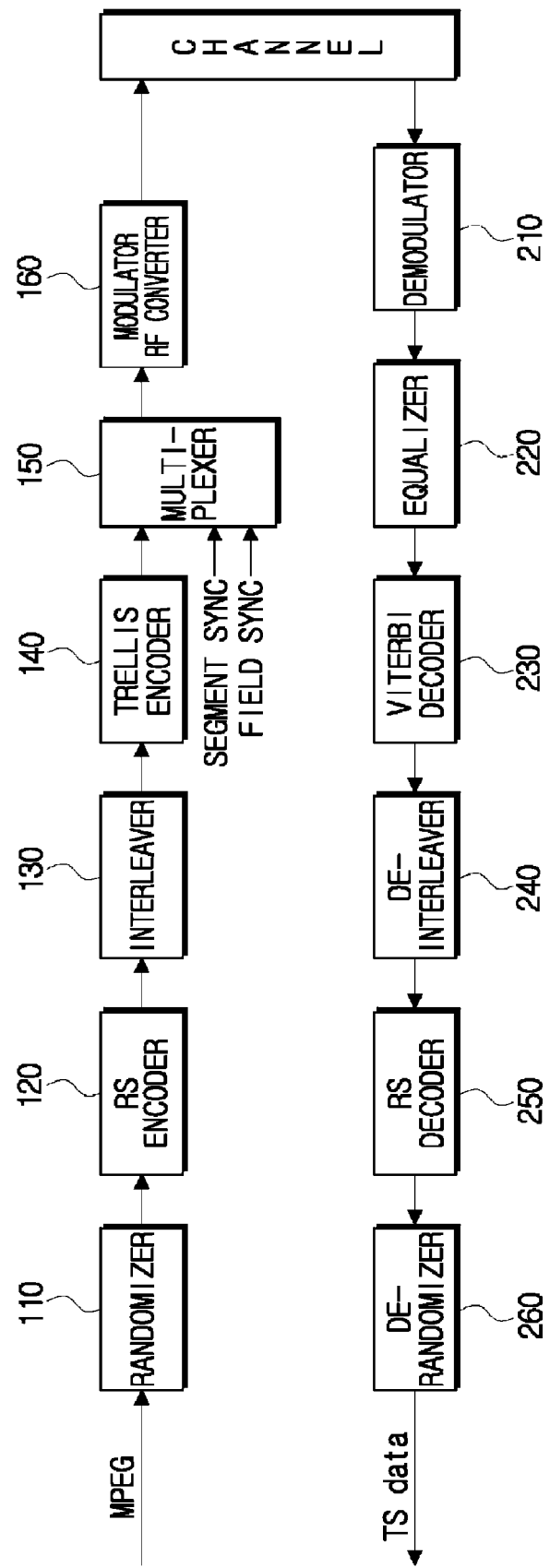
FIG. 1 is a block diagram illustrating the construction of a transmitting/receiving system of a general American-type digital broadcasting (ATSC VSB) system.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Also, well-known functions or constructions are not described in detail since they would obscure the invention in unnecessary detail.

Figure 3:
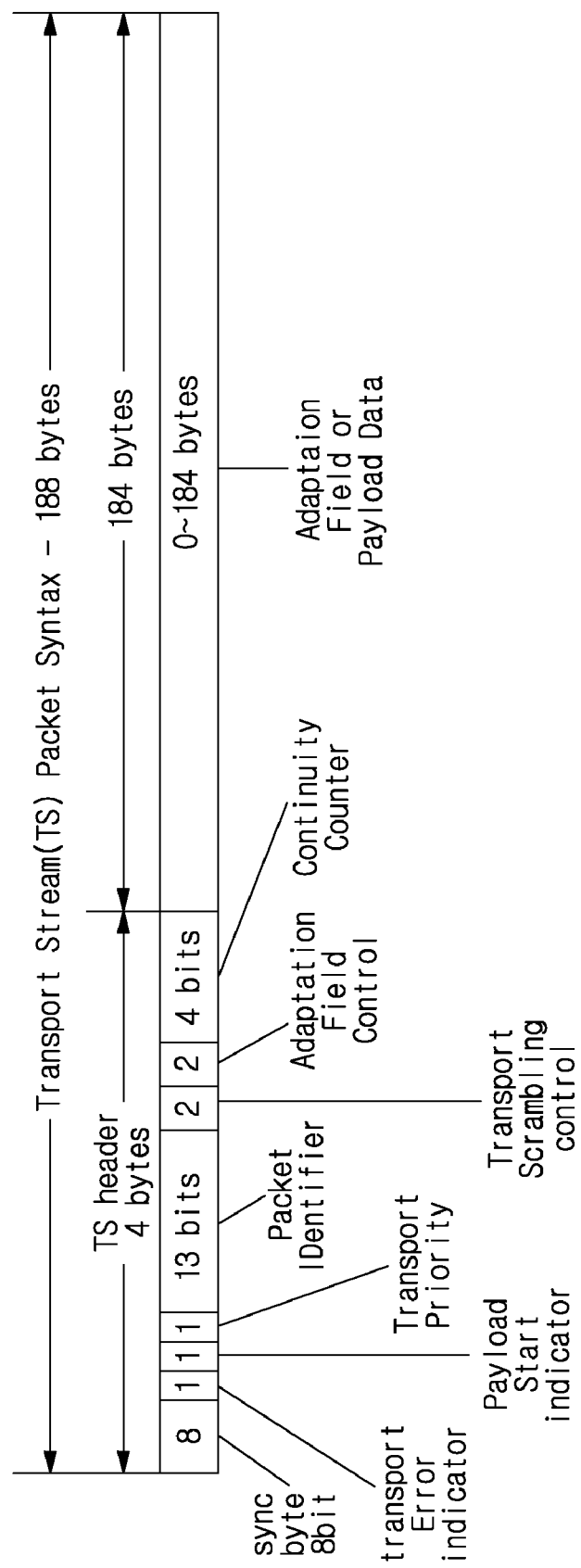
FIG. 3 is a view illustrating the structure of a general MPEG-2 transport stream packet.

FIG. 3 is a view illustrating the structure of a general MPEG-2 transport stream packet. Referring to FIG. 3, the general MPEG-2 transport stream is composed of a TS header part of 4 bytes, and an adaptation field or payload data of 184 bytes. As shown, TS header part includes an 8 bit sync byte, a 1 bit transport error indicator, a 1 bit payload start indicator, a 1 bit transport priority indicator, a 13 bit packet identifier (PID), a 2 bit transport scrambling control, a 2 bit adaptation field control, and a 4 bit continuity counter.

Figure 4:
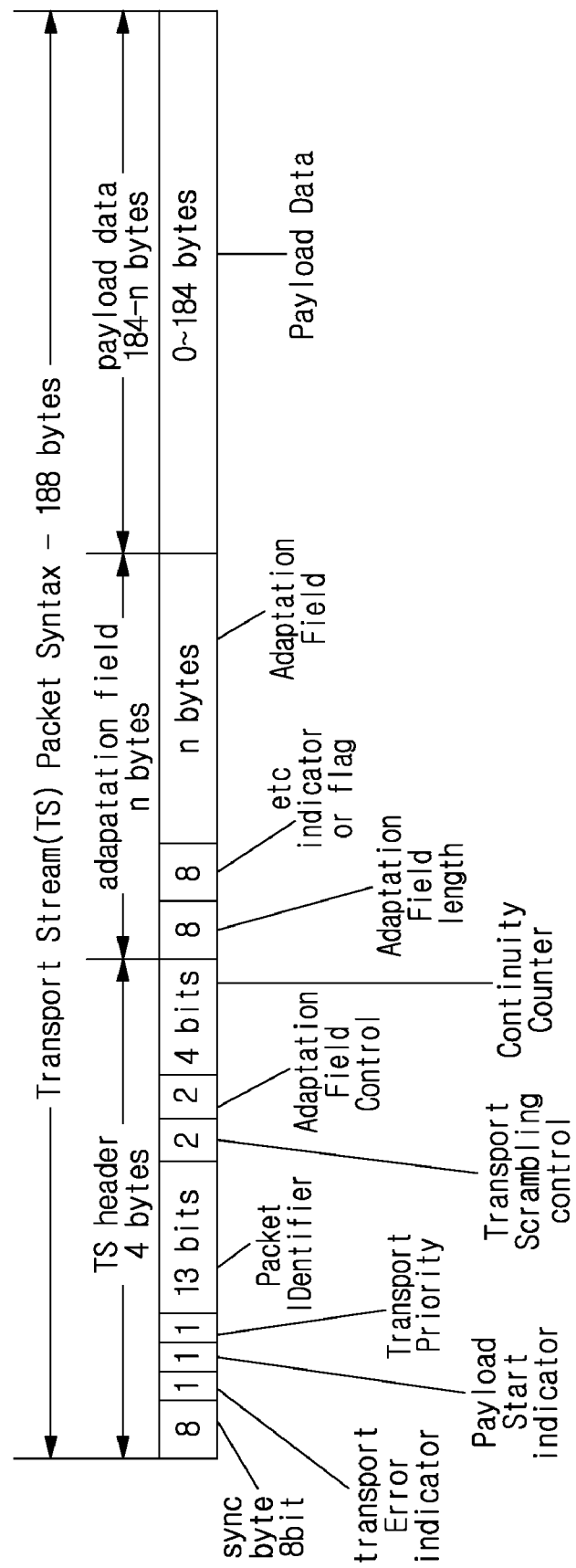
FIG. 4 is a view illustrating the structure of an MPEG-2 transport stream packet that includes an adaptation field according to the present invention.

FIG. 4 is a view illustrating the structure of an MPEG-2 transport stream packet that includes an adaptation field to which stuff bytes are added according to an aspect of the present invention. Referring to FIG. 4, the MPEG-2 transport stream includes a header part of 4 bytes, an adaptation field of "n" bytes, and payload data of "184-n" bytes. Two bytes of the adaptation field include an adaptation field header (AF header) including information about the length of the adaptation field. Stuff bytes that simply occupy a space without containing information may be inserted after the adaptation field header. The existence/nonexistence of the adaptation field is determined by the value of an adaptation field control bit in a TS header of the transport stream. Also shown is at 8 bit etc indicator or flag.

In an aspect of the present invention, an MPEG-2 TS packet in which stuff bytes are inserted into an adaptation field of a transport stream such as a data format as illustrated in FIG. 4 is used as an input of a transmitter. FIGS. 5a to 5e are views illustrating diverse formats of an MPEG-2 transport stream into which a supplementary reference sequence (SRS) is to be inserted in order to implement the transmitter according to aspects of the present invention. Here, for convenience in explanation, three bytes after a sync byte of the transport stream are called a normal header, first two types of the adaptation field are called an adaptation field (AF) header.

Generally, the SRS is a special known sequence in a deterministic VSB frame that is inserted in such a way that a receiver equalizer can utilize this known sequence to mitigate dynamic multi-path and other adverse channel conditions. The equalizer uses these contiguous sequences to adapt itself to a dynamically changing channel. When the encoder states have been forced to a known Deterministic State (DTR) an appended pre-calculated "known sequence" of bits (SRS pattern) is then processed immediately in pre-determined way at specific temporal locations at the Interleaver input of the frame. The resulting symbols, at the Interleaver output, due to the way the ATSC Interleaver functions will appear as known contiguous symbol patterns in known locations in VSB frame, which is available to the receiver as additional equalizer training sequence. The data to be used in transport stream packets to create these known symbol sequence is introduced into the system in a backward compatible way using existing standard mechanisms. This data is carried in the MPEG2 adaptation field. Hence existing standards are leveraged, and compatibility is assured.

The RS Encoder preceding the Interleaver calculates the RS parity. Due to resetting Trellis Coder Memory (TCM) encoders, the calculated RS Parity bytes are wrong and need to be corrected. Thus an additional processing step is involved to correct parity errors in selected packets. All packets with parity errors will have their RS parity re-encoded. A (52) segment byte interleaver with unique time dispersion properties, that generates contiguous SRS pattern is leveraged to have adequate time to re-encode parity bytes. Required time to do this constraints the maximum number of SRS bytes.

FIG. 5a shows the structure of an MPEG-2 packet data of a basic form in a VSB system using the SRS data as a training sequence. This MPEG-2 packet data includes a normal header part (such as that shown in FIG. 3 and FIG. 4) composed of a one-byte sync signal and a three-byte PID (Packet Identity), a two-byte adaptation field (AF) header including information about the position of the stuff bytes, and stuff bytes of a specified length N. The remaining bytes of the packet data correspond to a normal stream that is typical payload data. Since the start position of the stuff bytes is fixed, the information about the byte position is expressed by information about the length of the stuff bytes. The stuff-byte length N may be in the range of 1 to 27. However, if the start position is not fixed, it is understood that start position information would be used.

FIGS. 5b to 5e illustrate packet structures having adaptation fields in which other information, such as a program clock reference (PCR), an original program clock reference (OPCR), a splice countdown (splice_count), and the like, are included in order to effectively use the SRS. In these cases, the adaptation field is constructed to have a uniform size. A part except for the AF header and information such as PCR, OPCR, splice_count, and others, corresponds to the stuff bytes to which the SRS is to be inserted.

Figure 6:
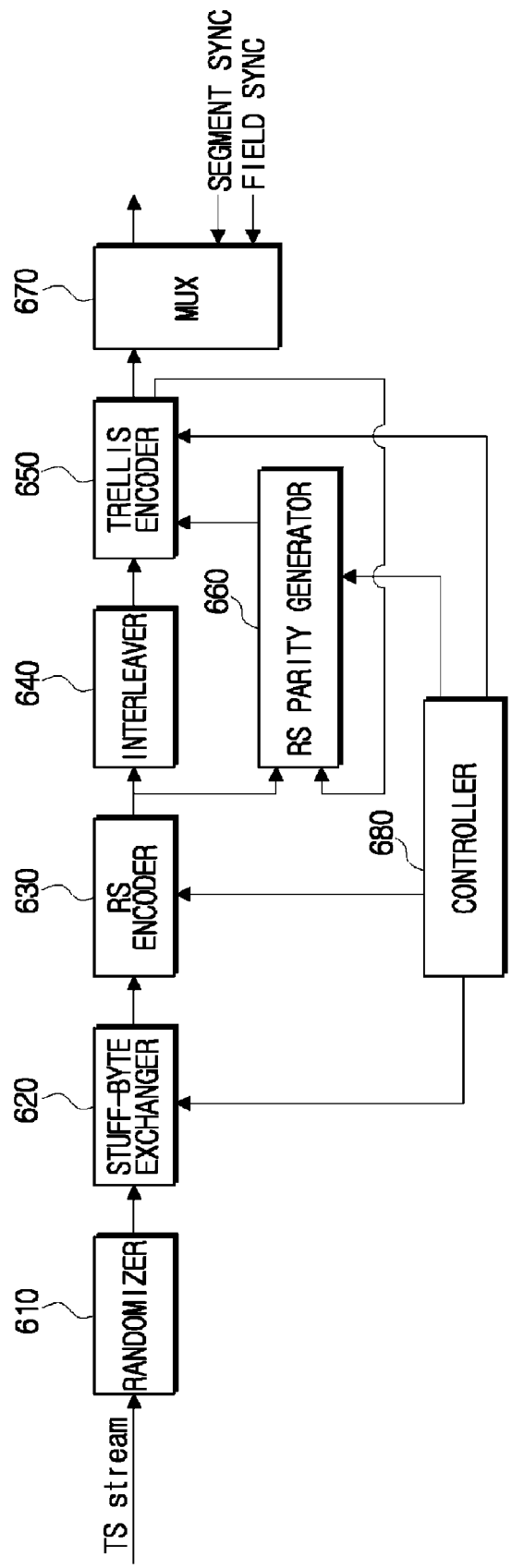
FIG. 6 is a block diagram illustrating the construction of a digital broadcast transmitter according to an embodiment of the present invention.

FIG. 6 is a block diagram illustrating the construction of a digital broadcast transmitting system according to an embodiment of the present invention. Referring to FIG. 6, the digital broadcast transmitter includes a randomizer 610, a stuff-byte exchanger 620, an RS encoder 630, an interleaver 640, a trellis encoder 650, an RS parity generator 660, a multiplexer 670, and a controller 680.

The randomizer 610 randomizes an input MPEG-2 transport steam data in order to heighten the utility of an allocated channel space. The data input to the randomizer 610 has the data format formed by inserting stuff bytes, which have a specified length of bytes, but does not include payload data as shown in FIGS. 5a to 5e, into a specified position of the input transport stream data. The payload data includes audio and/or video data, and can further include non AV data in other aspects of the invention.

The stuff-byte exchanger 620 generates known data that is a specified sequence having a specified pattern prearranged between a transmitter side and a receiver side. The stuff-byte exchanger 620 replaces the stuff bytes in a stuff-byte position of the randomized data by the known data. The known data can easily be detected from payload data to be transmitted, and thus is used for synchronization and equalization in the receiver side. In an aspect of the invention, the known data is SRS data.

The RS encoder 630 adds a parity of specified bytes to the packet into which the known data is inserted by the stuff-byte exchanger 620 to replace the stuff bytes in order to correct errors occurring due to channels. The interleaver 640 performs an interleaving of the data packet to which the parity output from the first RS encoder 630 is added in a specified pattern.

The trellis encoder 650 converts the data output from the interleaver 640 into data symbols, and performs a symbol mapping of the data symbols through a trellis encoding method at the rate of 2/3. As shown, the trellis encoder 650 initializes a value temporarily stored in its own memory device to a "00" state at the start point of the known data, and performs the trellis encoding of the known data. However, it is understood that other states can be initialized at the start point. Also, the trellis encoder 650 outputs a value for initializing the memory to the RS parity generator 660, receives a new parity generated by the RS parity generator, and replaces the corresponding existing parity by the received new parity.

The RS parity generator 660 generates a parity by performing an RS encoding of the MPEG-2 packet received from the RS encoder 630 using the value for initializing the memory received from the trellis encoder 650, and transmits the generated parity to the trellis encoder 650.

The controller 680 transmits position information of the stuff bytes and the known data to be replaced in the corresponding position to the stuff-byte exchanger 620. Also, the controller 680 transmits the position information of an initialization packet that includes a part used for the initialization among the packet of 187 bytes input to the RS parity generator 660 to the RS encoder 630, so that only the initialization packet can be used. For convenience in design, under the assumption that 27 or 26 stuff bytes are used even if the stuff bytes the number of which is smaller than 27 are used, 33 or 32 corresponding initialization packets are used as an input of the RS parity generator 660. However, it is understood that such an input need not be provided to the generator 660 in all aspects of the invention, and that other numbers of initializations can be used as the input.

Also, the controller 680 outputs signals for indicating the initialization area and parity area to be replaced to the trellis encoder 650. The trellis encoder 650 performs a memory initialization using these signals, receives the parity generated by the RS parity generation unit 660, and replaces the existing parity by the received parity.

Figure 2:
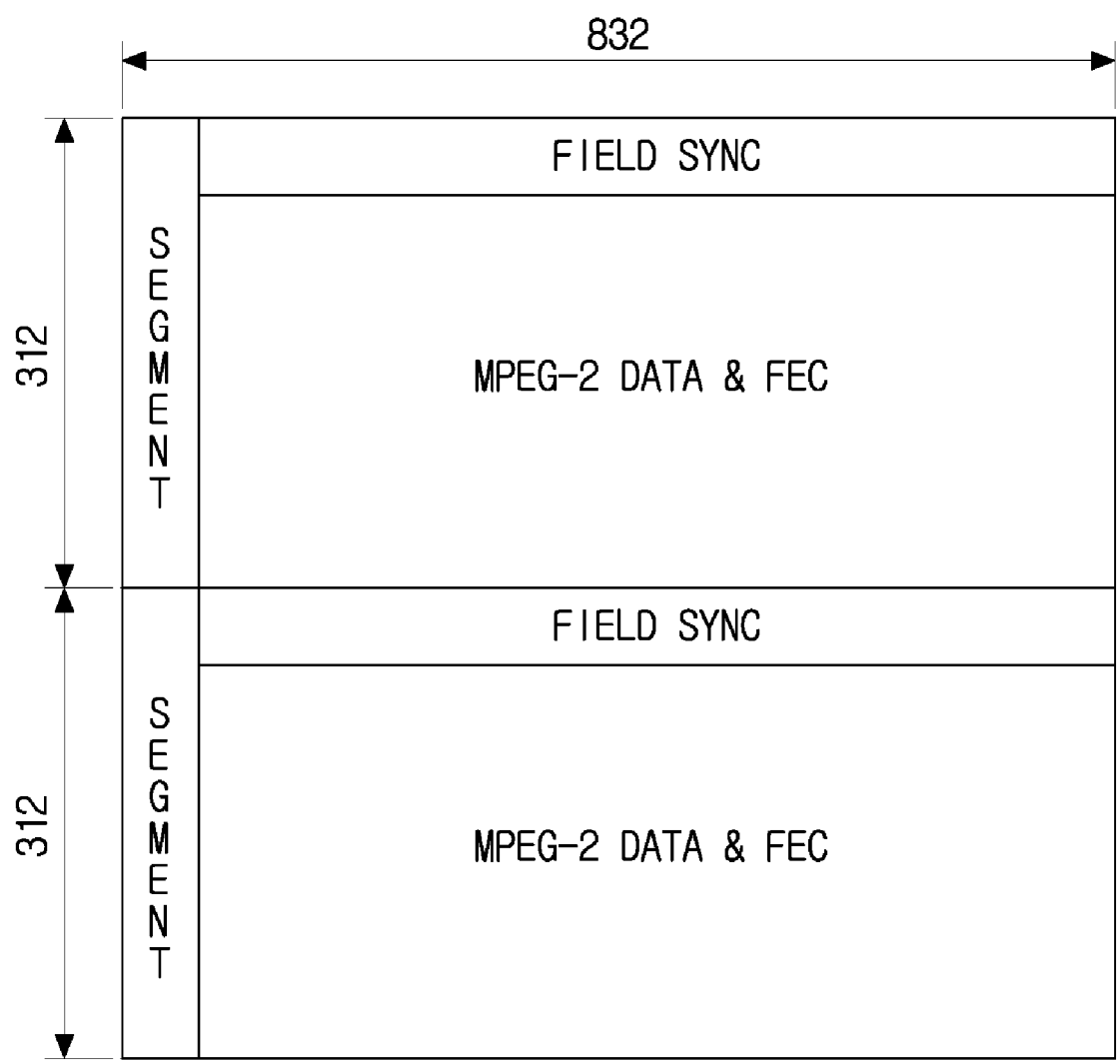
FIG. 2 is a view illustrating the structure of an ATSC VSB data frame.

The multiplexer 670 inserts a segment sync signal into the data converted into the symbols by the trellis encoder 650 in the unit of a segment, and inserts a field sync signal into the data in the unit of a field as the data format of FIG. 2. A modulator and RF converter (not illustrated) performs a VSB modulation of a signal into which a pilot signal has been inserted by performing a pulse shaping of the signal, carrying the pulse-shaped signal on an intermediate frequency (IF) carrier, and modulating the amplitude of the signal, performs an RF conversion and amplification of the modulated signal, and transmits an amplified RF-converted signal through a channel allocated with a specified band.

Hereinafter, the construction and the operation of the trellis encoder 650 of FIG. 7 will be explained in detail. The trellis encoder 650 receives the initialization area and the parity area to be replaced from the controller 680, initializes the memory, and outputs the value used for the memory initialization to the RS parity generator 660. Since the trellis encoder 650 has a feedback structure, its output is affected by the previous memory value. Accordingly, if the memory values of the trellis encoder 650 are not fixed although the stuff-byte exchanger 620 has replaced the stuff bytes of the transport stream with specified known data, the SRS of the known data may be output in various forms according to the memory value. In order to solve this problem, the memory of the trellis encoder 650 is initialized by changing an input value of the trellis encoder 650 as large as the number of stuff bytes at an SRS start point.

Figure 7:
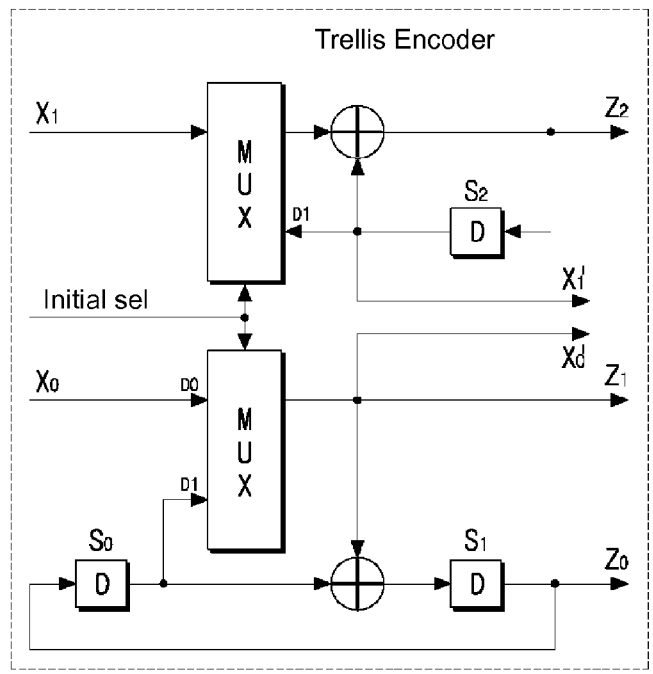
FIG. 7 is a view illustrating the construction of a trellis encoder of a digital broadcast transmitter according to an embodiment of the present invention.

FIG. 7 is a view illustrating the construction of a trellis encoder of a digital broadcast transmitter according to an embodiment of the present invention. If a memory initialization area for initializing the memory that exists in a start position of the SRS is input to the trellis encoder 650, initial_sel operates under the control of the controller 680, and a multiplexer (MUX) outputs a new value (X1', X0') (i.e., zero forcing input) that makes the memory state "0" instead of an input (X1, X0) previously used in the trellis encoder 650. Here, since there are two memories in a convolutional encoder of the trellis encoder 650, two successive symbols (i.e., 4 (=2*2)-bit input) are required in order to initialize the memories.

Specifically, the input X1, X0 are input to corresponding multiplexers with the initial_sel. The multiplexer corresponding to the input X1 further received an output D1, and has an output with respect to which an exclusive OR function is performed using the output D1. The result of the exclusive OR function is a mapping input Z2, which is stored in a memory S2 as a next value of the output D1. Once recalled from the memory S2, the output D1 is used as the new value X1'.

The multiplexer corresponding to the input X0 is multiplexed with a received output D1, and the output of the multiplexer is a mapping input Z1 and the new value X0'. An exclusive OR function is performed on the mapping input Z1 using the output D1, and a result is stored in a memory S1. The output of the memory S1 is the mapping input Z0, and is stored in a memory S0 to be recalled as the output D1.

Table 1 shows eight states of three memories S0, S1, and S2, and two successive input values for making the memory state "0".

TABLE 1

| Initial select | Present state (S0, S1, S2) | Input t = 0 (X1, X0) | Next state/ Present state (S0, S1, S2) | Input t = 1 (X1, X0) | Next state (S0, S1, S2) | Output (z2, z1, z0) |
|---|---|---|---|---|---|---|
| 1 | 0, 0, 0 | 0, 0 | 0, 0, 0 | 0, 0 | 0, 0, 0 | 000 |
| 1 | 0, 0, 1 | 0, 1 | 0, 0, 0 | 0, 0 | 0, 0, 0 | 000 |
| 1 | 0, 1, 0 | 0, 0 | 1, 0, 0 | 1, 0 | 0, 0, 0 | 000 |
| 1 | 0, 1, 1 | 0, 1 | 1, 0, 0 | 1, 0 | 0, 0, 0 | 000 |
| 1 | 1, 0, 0 | 1, 0 | 0, 0, 0 | 0, 0 | 0, 0, 0 | 000 |
| 1 | 1, 0, 1 | 1, 1 | 0, 0, 0 | 0, 0 | 0, 0, 0 | 000 |
| 1 | 1, 1, 0 | 1, 0 | 1, 0, 0 | 1, 0 | 0, 0, 0 | 000 |
| 1 | 1, 1, 1 | 1, 1 | 1, 0, 0 | 1, 0 | 0, 0, 0 | 000 |

The trellis encoder 650 of FIG. 7 outputs X1' and X0' used for the memory initialization to the RS parity generator 660. Since new input (X1', X0') is used as an input of the trellis encoder 650, the parity of the MPEG-2 packet that includes the value (X1, X0) becomes an inaccurate parity. In order to form an accurate parity, the trellis encoder 650 should construct the parity using the new input (X1', X0') instead of the existing input (X1, X0). The generation of the parity is performed through the RS parity generator 660. The parity newly generated by the RS parity generator 660 is sent to the trellis encoder 650, and the trellis encoder 650 replaces the exiting parity by the newly generated parity.

Figure 8:
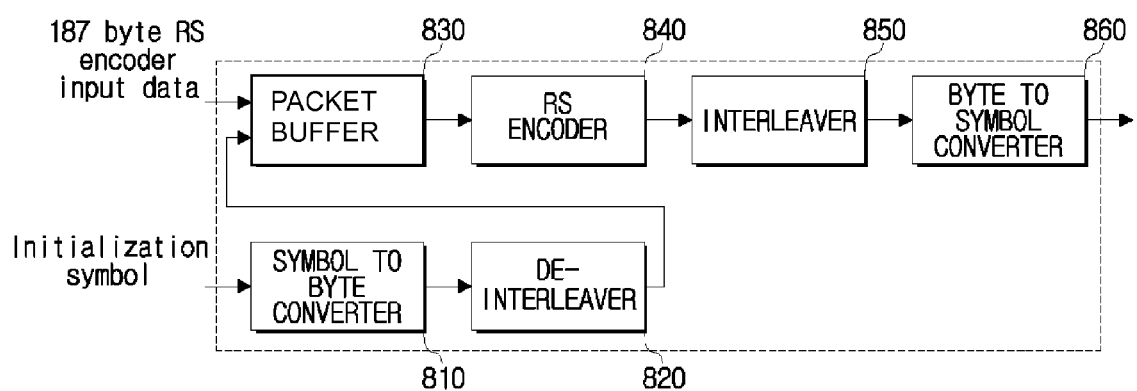
FIG. 8 is a block diagram illustrating the construction of an RS parity generator of a digital broadcast transmitter according to an embodiment of the present invention.

FIG. 8 is a block diagram illustrating the construction of an RS parity generator of a digital broadcast transmitter according to an embodiment of the present invention. Referring to FIG. 8, the RS parity generator 660 includes a symbol-to-byte converter 810, a data deinterleaver 820, a packet buffer 830, an RS encoder 840, a data interleaver 850, and a byte-to-symbol converter 860. The symbol-to-byte converter 810 receives an initialization symbol composed of two bits from the trellis encoder 650, and performs a symbol-to-byte conversion. According to an aspect of the invention, the symbol-to-byte conversion is a reverse to the D.2 byte-to-symbol table of the "ATSC Digital Television Standard" (document A/53), the disclosure of which is incorporated by reference.

An example of the byte-to-symbol table is as follows:

| Symbol | Segment 0 | | | Segment 1 | | | Segment 2 | | | Segment 3 | | | Segment 4 | | |
|---|---|---|---|---|---|---|---|---|---|---|---|---|---|---|---|
| | Trellis | Byte | Bits | Trellis | Byte | Bits | Trellis | Byte | Bits | Trellis | Byte | Bits | Trellis | Byte | Bits |
| 0 | 0 | 0 | 7, 6 | 4 | 208 | 5, 4 | 8 | 412 | 3, 2 | 0 | 616 | 1, 0 | 4 | 828 | 7, 6 |
| 1 | 1 | 1 | 7, 6 | 5 | 209 | 5, 4 | 9 | 413 | 3, 2 | 1 | 617 | 1, 0 | 5 | 829 | 7, 6 |
| 2 | 2 | 2 | 7, 6 | 6 | 210 | 5, 4 | 10 | 414 | 3, 2 | 2 | 618 | 1, 0 | 6 | 830 | 7, 6 |
| 3 | 3 | 3 | 7, 6 | 7 | 211 | 5, 4 | 11 | 415 | 3, 2 | 3 | 619 | 1, 0 | ... | ... | ... |
| 4 | 4 | 4 | 7, 6 | 8 | 212 | 5, 4 | 0 | 416 | 3, 2 | 4 | 620 | 1, 0 | ... | ... | ... |
| 5 | 5 | 5 | 7, 6 | 9 | 213 | 5, 4 | 1 | 417 | 3, 2 | 5 | 621 | 1, 0 | ... | ... | ... |
| 6 | 6 | 6 | 7, 6 | 10 | 214 | 5, 4 | 2 | 418 | 3, 2 | 6 | 622 | 1, 0 | ... | ... | ... |
| 7 | 7 | 7 | 7, 6 | 11 | 215 | 5, 4 | 3 | 419 | 3, 2 | 7 | 623 | 1, 0 | ... | ... | ... |
| 8 | 8 | 8 | 7, 6 | 0 | 204 | 5, 4 | 4 | 408 | 3, 2 | 8 | 612 | 1, 0 | ... | ... | ... |
| 9 | 9 | 9 | 7, 6 | 1 | 205 | 5, 4 | 5 | 409 | 3, 2 | 9 | 613 | 1, 0 | ... | ... | ... |
| 10 | 10 | 10 | 7, 6 | 2 | 206 | 5, 4 | 6 | 410 | 3, 2 | 10 | 614 | 1, 0 | ... | ... | ... |
| 11 | 11 | 11 | 7, 6 | 3 | 207 | 5, 4 | 7 | 411 | 3, 2 | 11 | 615 | 1, 0 | ... | ... | ... |
| 12 | 0 | 0 | 5, 4 | 4 | 208 | 3, 2 | 8 | 412 | 1, 0 | 0 | 624 | 7, 6 | ... | ... | ... |
| 13 | 1 | 1 | 5, 4 | 5 | 209 | 3, 2 | 9 | 413 | 1, 0 | 1 | 625 | 7, 6 | ... | ... | ... |
| ... | ... | ... | ... | ... | ... | ... | ... | ... | ... | ... | ... | ... | ... | ... | ... |
| 19 | 7 | 7 | 5, 4 | 11 | 215 | 3, 2 | 3 | 419 | 1, 0 | 7 | 631 | 7, 6 | ... | ... | ... |
| 20 | 8 | 8 | 5, 4 | 0 | 204 | 3, 2 | 4 | 408 | 1, 0 | 8 | 632 | 7, 6 | ... | ... | ... |
| 21 | 9 | 9 | 5, 4 | 1 | 205 | 3, 2 | 5 | 409 | 1, 0 | 9 | 633 | 7, 6 | ... | ... | ... |
| 22 | 10 | 10 | 5, 4 | 2 | 206 | 3, 2 | 6 | 410 | 1, 0 | 10 | 634 | 7, 6 | ... | ... | ... |
| 23 | 11 | 11 | 5, 4 | 3 | 207 | 3, 2 | 7 | 411 | 1, 0 | 11 | 635 | 7, 6 | ... | ... | ... |
| 24 | 0 | 0 | 3, 2 | 4 | 208 | 1, 0 | 8 | 420 | 7, 6 | 0 | 624 | 5, 4 | ... | ... | ... |
| 25 | 1 | 1 | 3, 2 | 5 | 209 | 1, 0 | 9 | 421 | 7, 6 | 1 | 625 | 5, 4 | ... | ... | ... |
| ... | ... | ... | ... | ... | ... | ... | ... | ... | ... | ... | ... | ... | ... | ... | ... |
| 31 | 7 | 7 | 3, 2 | 11 | 215 | 1, 0 | 3 | 427 | 7, 6 | ... | ... | ... | ... | ... | ... |
| 32 | 8 | 8 | 3, 2 | 0 | 204 | 1, 0 | 4 | 428 | 7, 6 | ... | ... | ... | ... | ... | ... |
| 33 | 9 | 9 | 3, 2 | 1 | 205 | 1, 0 | 5 | 429 | 7, 6 | ... | ... | ... | ... | ... | ... |
| 34 | 10 | 10 | 3, 2 | 2 | 206 | 1, 0 | 6 | 430 | 7, 6 | ... | ... | ... | ... | ... | ... |
| 35 | 11 | 11 | 3, 2 | 3 | 207 | 1, 0 | 7 | 431 | 7, 6 | ... | ... | ... | ... | ... | ... |
| 36 | 0 | 0 | 1, 0 | 4 | 216 | 7, 6 | 8 | 420 | 5, 4 | ... | ... | ... | ... | ... | ... |
| 37 | 1 | 1 | 1, 0 | 5 | 217 | 7, 6 | 9 | 421 | 5, 4 | ... | ... | ... | ... | ... | ... |
| ... | ... | ... | ... | ... | ... | ... | ... | ... | ... | ... | ... | ... | ... | ... | ... |
| 47 | 11 | 11 | 1, 0 | 3 | 227 | 7, 6 | ... | ... | ... | ... | ... | ... | ... | ... | ... |
| 48 | 0 | 12 | 7, 6 | 4 | 216 | 5, 4 | ... | ... | ... | ... | ... | ... | ... | ... | ... |
| 49 | 1 | 13 | 7, 6 | 5 | 217 | 5, 4 | ... | ... | ... | ... | ... | ... | ... | ... | ... |

-continued

| Symbol | Segment 0 | | | Segment 1 | | | Segment 2 | | | Segment 3 | | | Segment 4 | | |
|---|---|---|---|---|---|---|---|---|---|---|---|---|---|---|---|
| | Trellis | Byte | Bits | Trellis | Byte | Bits | Trellis | Byte | Bits | Trellis | Byte | Bits | Trellis | Byte | Bits |
| ... | ... | ... | ... | ... | ... | ... | ... | ... | ... | ... | ... | ... | ... | ... | ... |
| 95 | 11 | 23 | 1, 0 | ... | ... | ... | ... | ... | ... | ... | ... | ... | ... | ... | ... |
| 96 | 0 | 24 | 7, 6 | ... | ... | ... | ... | ... | ... | ... | ... | ... | ... | ... | ... |
| 97 | 1 | 25 | 7, 6 | ... | ... | ... | ... | ... | ... | ... | ... | ... | ... | ... | ... |
| ... | ... | ... | ... | ... | ... | ... | ... | ... | ... | ... | ... | ... | ... | ... | ... |
| 767 | 11 | 191 | 1, 0 | ... | ... | ... | ... | ... | ... | ... | ... | ... | ... | ... | ... |
| 768 | 0 | 192 | 7, 6 | ... | ... | ... | ... | ... | ... | ... | ... | ... | ... | ... | ... |
| 769 | 1 | 193 | 7, 6 | ... | ... | ... | ... | ... | ... | ... | ... | ... | ... | ... | ... |
| ... | ... | ... | ... | ... | ... | ... | ... | ... | ... | ... | ... | ... | ... | ... | ... |
| 815 | 11 | 203 | 1, 0 | 3 | 419 | 7, 6 | 7 | 623 | 5, 4 | 11 | 827 | 3, 2 | ... | ... | ... |
| 816 | 0 | 204 | 7, 6 | 4 | 408 | 5, 4 | 8 | 612 | 3, 2 | 0 | 816 | 1, 0 | ... | ... | ... |
| 817 | 1 | 205 | 7, 6 | 5 | 409 | 5, 4 | 9 | 613 | 3, 2 | 1 | 817 | 1, 0 | ... | ... | ... |
| ... | ... | ... | ... | ... | ... | ... | ... | ... | ... | ... | ... | ... | ... | ... | ... |
| 827 | 11 | 215 | 7, 6 | 3 | 419 | 5, 4 | 7 | 623 | 3, 2 | 11 | 827 | 1, 0 | ... | ... | ... |

The data deinterleaver 820 deinterleaves the symbol-to-byte converted value, and then outputs the deinterleaved value to the packet buffer 830. The packet buffer 830 temporarily stores a packet that includes the output of the data deinterleaver 820 and the initialization area in the unit of 187 bytes output from the RS encoder 630. The packet buffer 830 replaces the value in the existing initialization area by a new value. In this case, all bits constituting one byte are not used as the replaced input, but only four upper bits of the byte used for the initialization are replaced. The RS encoder 840 performs an RS encoding of the output of the packet buffer 830, and adds the parity to the encoded output. Here, the parity generated by the RS encoder 630 passes through the data deinterleaver 820. The output of the data deinterleaver 820 is byte-to-symbol-converted according to D.2 table of the "ATSC Digital Television Standard" (document A/53), and is used as an input of the trellis encoder 650.

Figure 9:
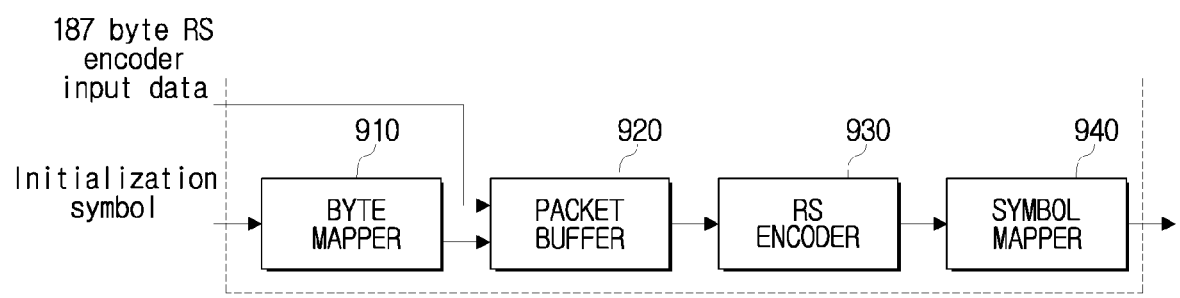
FIG. 9 is a block diagram illustrating an example of an RS parity generator of a digital broadcast transmitter according to an embodiment of the present invention.

FIG. 9 is a block diagram illustrating an example of a parity generator 660 of a digital broadcast transmitter, which operates at high speed and solves a delay problem occurring during the operation of the interleaver 850 and the deinterleaver 820, according to an embodiment of the present invention. The parity generator 660 of FIG. 9 includes include a byte mapper 910, a packet buffer 920, an RS encoder 930, and a symbol buffer 940.

The byte mapper 910 performs mapping of the initialization symbols input from the trellis encoder 650 onto the byte-to-symbol-converted and interleaved value, and outputs the mapped symbols to the packet buffer 920. The packet buffer 920 temporarily stores a packet that includes the output of the byte mapper and the initialization area in the unit of 187 bytes output from the RS encoder 650. After the data replacement is performed in the packet buffer 920, the output of the packet buffer is RS-encoded by the RS encoder 930, and then is input to the trellis encoder 650 at high speed, through the symbol mapper 940. The symbol mapper 940 simultaneously operates the interleaver and the byte-to-symbol converter of FIG. 8.

Figure 10:
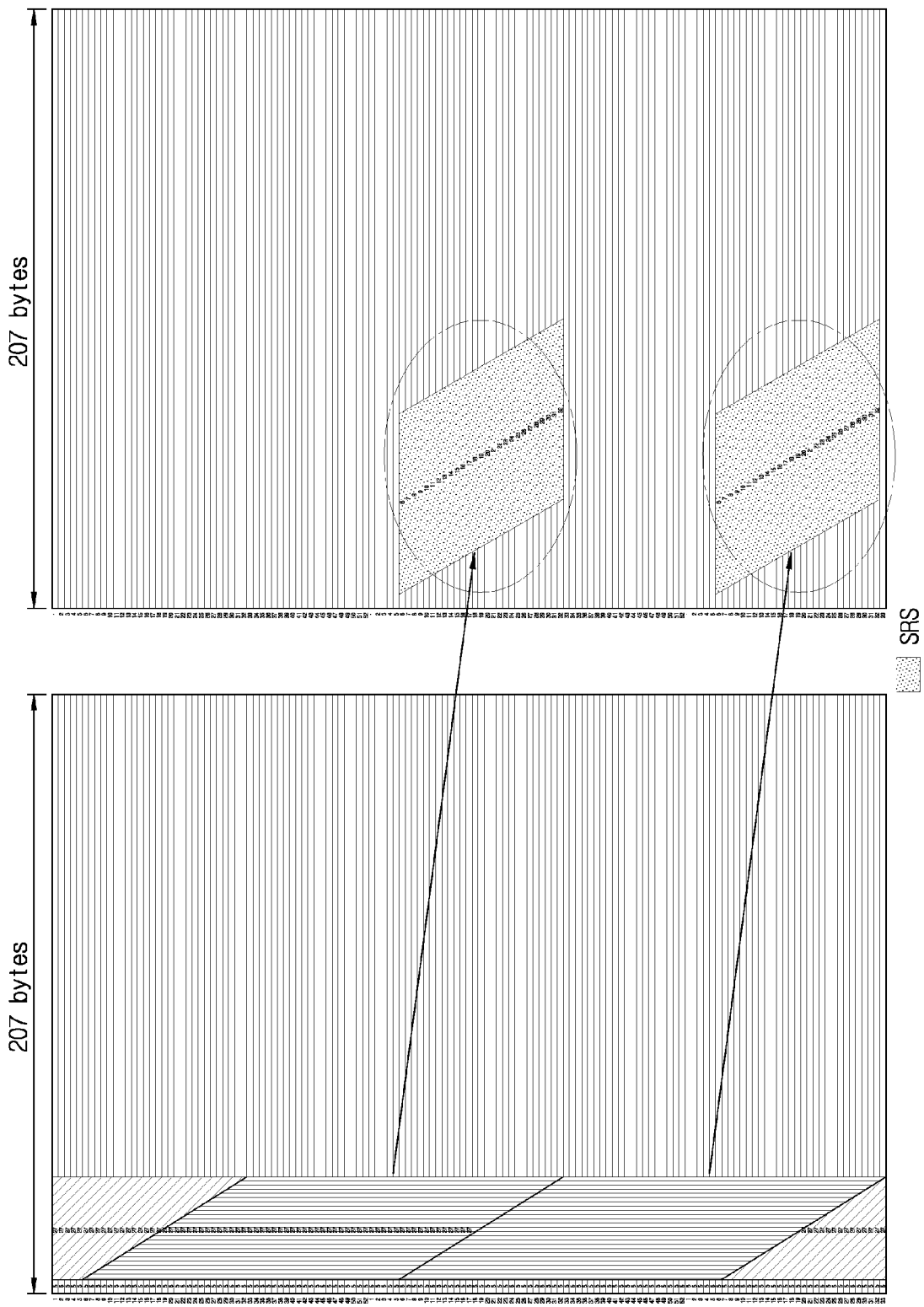
FIG. 10 is a view explaining an SRS area of an interleaver according to an aspect of the present invention.

FIGS. 10 to 14B are views illustrating data formats for explaining an example of the operation of the present invention. First, FIG. 10 is a view explaining the change of an SRS area of a transport stream according to an interleaving operation of the interleaver 640 according to an aspect of the present invention.

The stuff bytes for the SRS that exist in 207 packets output from the RS encoder 630 according to the interleaving appear repeatedly in the unit of 52 segments. The stuff bytes are arranged in a horizontal direction according to the interleaving. Here, the first horizontal line corresponds to the first stuff byte, the second horizontal line the second stuff byte, and the N-th horizontal line the N-th stuff byte, respectively. As illustrated in FIG. 2, the VSB frame has 312 data segments arranged after a field sync segment. That is, since 312/52=6, six identical SRSs in the unit of 52 segments are arranged after the field sync segment.

Figure 11:
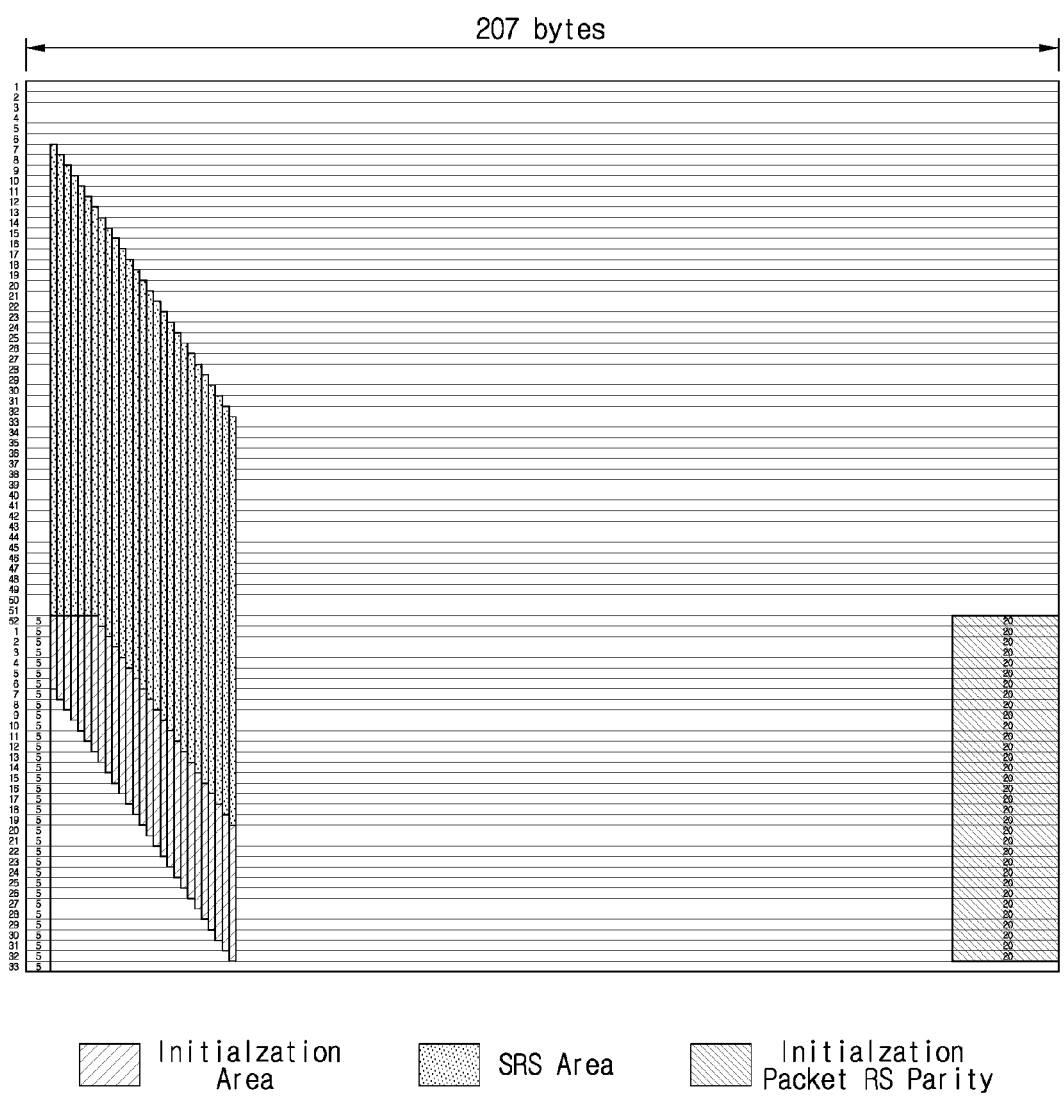
FIG. 11 is a view illustrating an input frame of an interleaver according to an aspect of the present invention.

FIG. 11 is a view illustrating an SRS area, an initialization area, and an initialization packet RS parity, as seen from the output of the RS encoder in the case where the length of the stuff bytes is 27. The initialization packet RS parity is a parity corresponding to the initialization area, and indicates the parity to be replaced by a new parity according to the initialization of the trellis encoder. As illustrated in FIG. 10, a lower part of 52 bytes first appears after the interleaving, and this part becomes the initialization area.

One to 27 stuff bytes can be used for the SRS according to an aspect of the invention. When N stuff bytes are used for the SRS, up to N parities corresponding to the initialization area become the initialization packet RS parities as shown in FIG. 11. For example, if one stuff byte is used, as shown in FIG. 11, the initialization area of the first stuff byte has a size of 7 bytes, and seven packets 52, 1, 2, 3, 4, 5, and 6 that include the initialization area are used for the initialization. The initialization area of the second stuff byte has a size of 8 bytes, and packets 52, 1, 2, 3, 4, 5, 6, and 7 are used for the initialization.

As illustrated, if N stuff bytes (i.e., the first stuff byte to the N-th stuff byte) are used to form the SRS, packets 52, 1, 2, 3, . . . , N+4, and N+5 correspond to packets that include the initialization area. That is, the parities of N+6 packets include the initialization area, the parities become the initialization packet RS parities, that will be replaced later. If N=27, parities of the packets 52, 1, 2, 3, . . . , 31, and 32, i.e., 33 parities, become the initialization packet RS parities.

On the other hand, since a TCM encoder used in the ATSC performs a trellis encoding in the unit of 12 symbols, 12 TCM encoders should be initialized for a complete initialization, but are not required in all aspects of the invention. However, due to causality, the first to fifth stuff bytes can initialize 7, 8, 9, 10, and 110 TCM encoders, respectively. Other stuff bytes used for the SRS can all be used for the initialization. This number is equal to the size of the initialization area of the respective stuff byte as illustrated in FIG. 11. In FIG. 11, since four symbols of the respective byte (two bits are used to construct one symbol) pass through the same TCM encoder, one byte can initialize one TCM encoder. As described above, since the initialization becomes possible with only two symbols, i.e., 4 (=2*2) bits, only four MSB bits of the initialization position are used for the initialization, and four LSB bits are used to construct the SRS.

Figure 12:
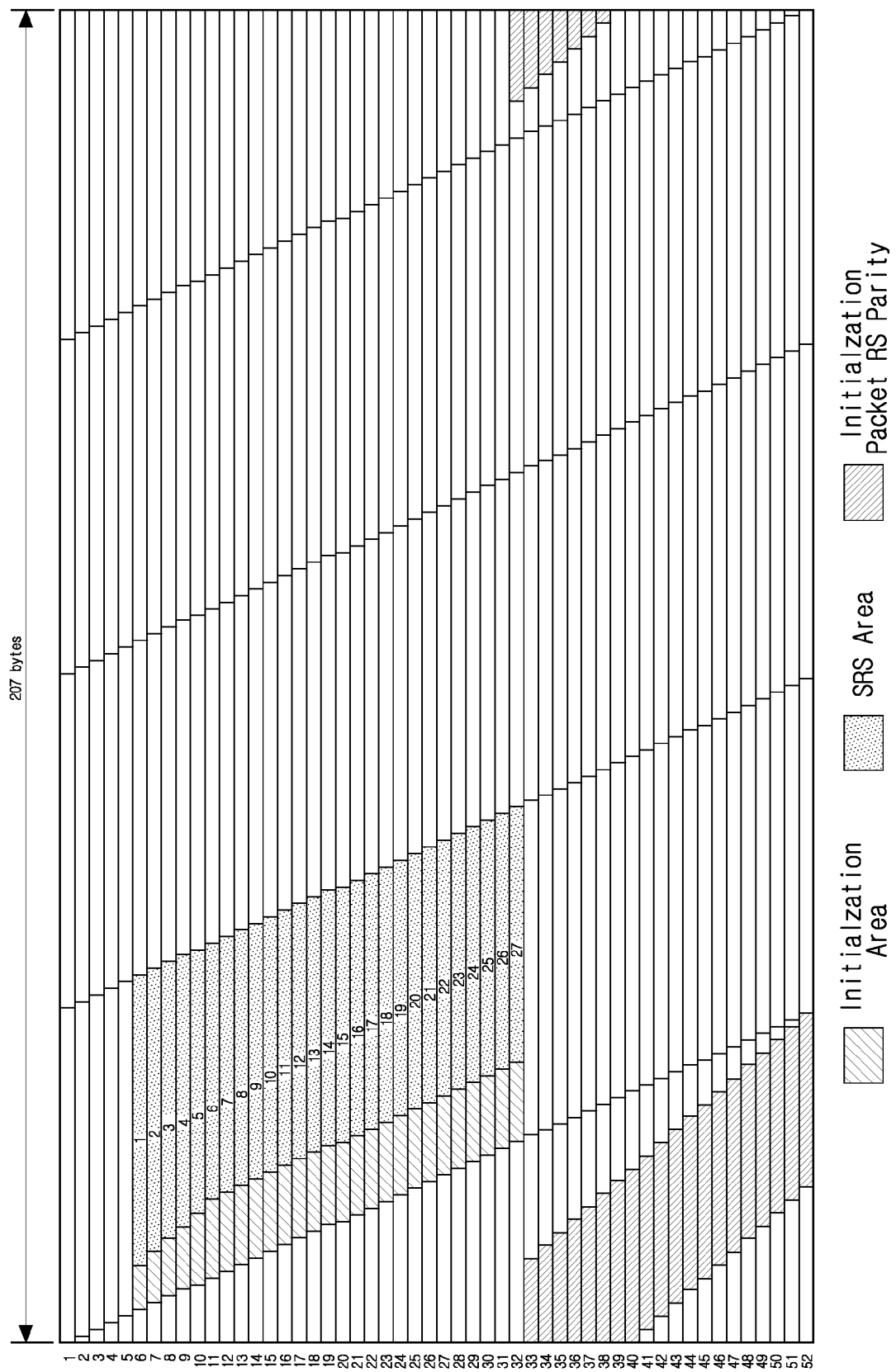
FIG. 12 is a view illustrating an output frame of an interleaver according to an aspect of the present invention.

FIG. 12 is a view illustrating the data format of an output of the RS encoder 630 after the data passes through the data interleaver 640. After the initialization area of 27 stuff bytes, parities corresponding to only 33 packets, i.e., packets 52, 1, 2, ..., 31, and 32, appear. On the other hand, as described above, the output of the trellis encoder 650 and the next memory state are affected by the previous memory value. That is, if the previous input is changed, an input to be used for the initialization is changed. If the parity of the packet corresponding to the initialization area precedes the initialization area, the input value previously used to initialize the memory of the trellis encoder 650 is changed due to the newly generated parity. In this case, the initialization may not be performed, or an accurate parity cannot be generated using the initialization value. Accordingly, in order to prevent the parity of the initialization packet from preceding the initialization area as shown in FIG. 12, the maximum number of used stuff bytes becomes 27. However, it is understood that, for other types of packets divided into other numbers of segments, other maximum numbers of used stuff bytes can be imposed.

For the reason as described above, the trellis encoder 650 can initialize up to seven first stuff bytes. The initialization positions of the five remaining stuff bytes exist in the packets 47, 48, 49, 50, and 51, and since the parities of all the packets to be replaced precede the initialization positions, parities cannot be used for the initialization.

Figure 13:
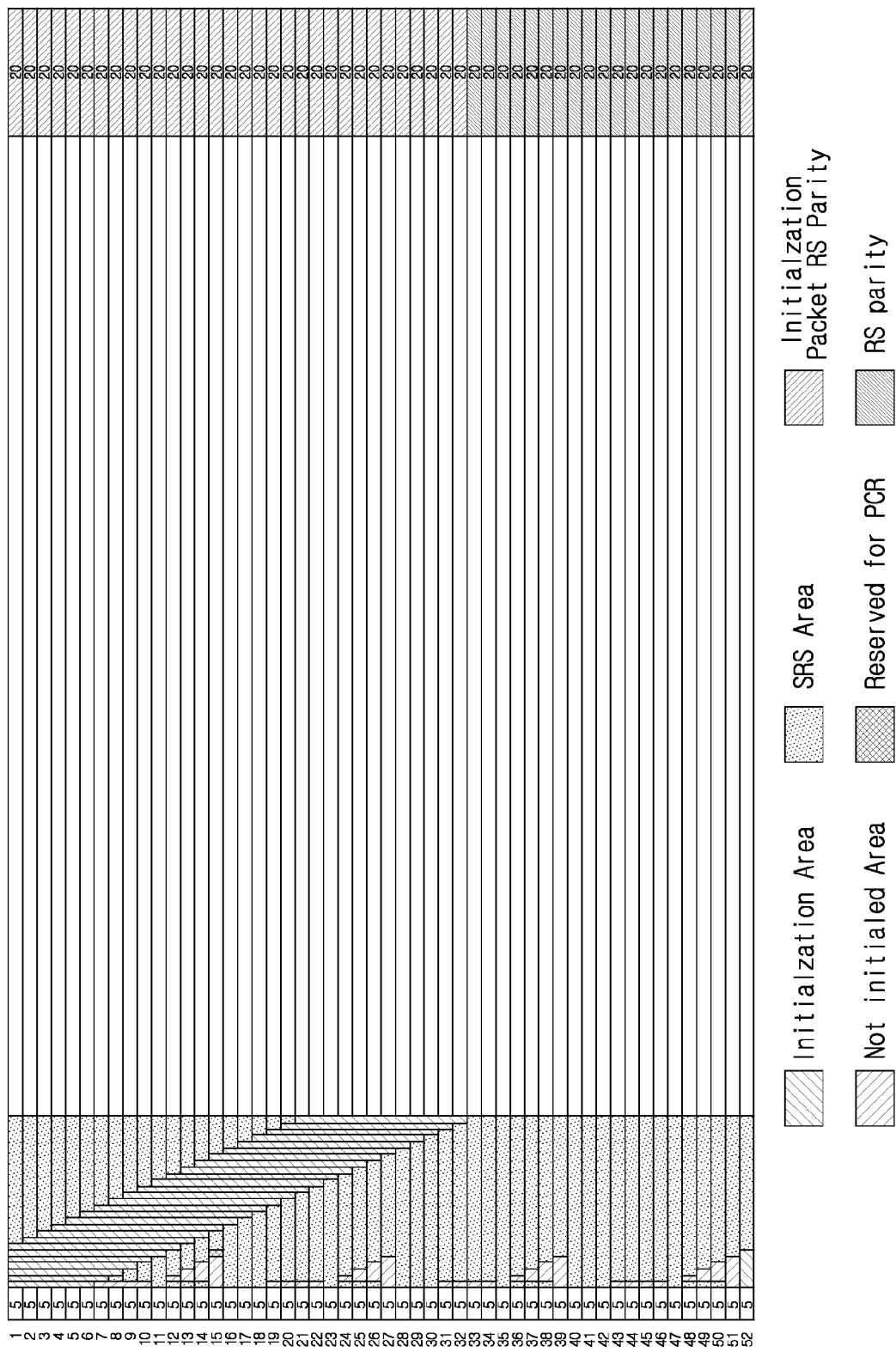
FIG. 13 is a view illustrating an input frame of a repeated structure of an interleaver according to an aspect of the present invention.

FIG. 13 is a view illustrating the structure of a TS packet that is repeated in the unit of 52 segments. In FIG. 13, the output form of the RS encoder 630 in the case where 27 stuff bytes are used for the SRS is illustrated. If less than 27 stuff bytes are used, the initialization packet RS parities are reduced as much as a part corresponding to the reduced area. Since the non-initialized part is not used for the SRS, it can be used for other purposes. In the drawing, if the PCR is transferred through the 15$^{th}$ packet, it invades one byte of the SRS since it occupies a 6-byte space. In this case, the corresponding space is not used for the SRS, and 6 bytes including the front 5 bytes are used to transmit the PCR.

Figure 14A:
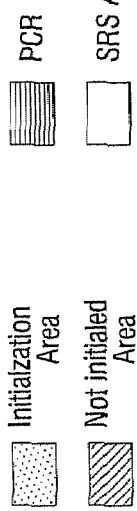
FIGS. 14A and 14B are a view illustrating an input frame of a stuff-byte exchanger according to an aspect of the present invention.
Figure 14B:

FIGS. 14A and 14B are a view illustrating input values of a stuff-byte exchanger for generating the SRS according to an aspect of the present invention. The SRS pattern byte values are determined such that after the specific known data pass through the TCM encoders, the output specific known data has a spectrum similar to that of pseudo noise and has an average DC (direct current) value close to 0. If less than 27 stuff bytes are used, the replacement is performed as many as the number of the stuff bytes. For example, if 10 stuff bytes are used, the SRS is generated in replacement of 10 corresponding parts. The lower four bits of the initialization area are used for the SRS, while certain values may enter into the upper four bits. Also, any value may enter into a non-initialized part. However, if the PCR is used, any other value cannot enter into the PCR position so that the PCR is transferred as it is.

Figure 15:
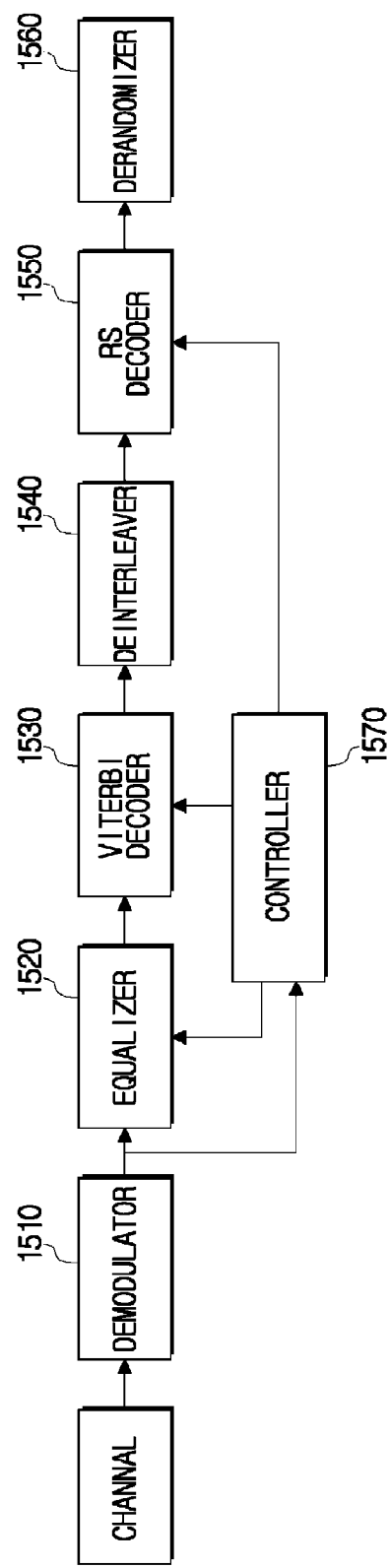
FIG. 15 is a block diagram illustrating the construction of a digital broadcast receiver according to an embodiment of the present invention.

FIG. 15 is a block diagram illustrating the construction of a digital broadcast receiver according to an embodiment of the present invention. The digital broadcast receiver of FIG. 15 includes a demodulator 1510, an equalizer 1520, a Viterbi decoder 1530, a deinterleaver 1540, an RS decoder 1550, a derandomizer 1560, and a controller 1570. A tuner (not illustrated) converts an RF signal received through a channel into a baseband signal, and the demodulator 1510 performs a sync detection and demodulation of the converted baseband signal. While described in terms of a Viterbi decoder, it is understood that other decoders and/or symbol identifiers can be used.

The equalizer 1520 compensates for a channel distortion of the demodulated signal due to the multi-path of the channel. Also, the equalizer 1520 receives the known data (such as SRS) from the controller 1570, and uses it for the channel distortion compensation. The Viterbi decoder 1530 error-corrects and decodes the equalized signal from the equalizer 1520. The deinterleaver 1540 rearranges the data dispersed by the interleaver of the transmitter.

The deinterleaved data is error-corrected through the RS decoder 1550, and the error-corrected data is derandomized through the derandomizer 1560, so that the data of the MPEG-2 transport stream is restored. On the other hand, the controller 1570 transmits the SRS period and values of the SRS to the equalizer 1520 to use them for the performance improvement. The SRS period and the values of the SRS are determined according to the mode, and this mode may be predetermined or the mode signal may be transmitted from the transmitter. In the case where the transmitter sends the mode signal, the controller 1570 detects the mode signal, and sends the SRS period and values of the SRS corresponding to the mode to the equalizer 1520. In order to construct the SRS having fixed values, its inputs should be determined as specified values as shown in FIGS. 14A and 14B. In order to improve the performance, the Viterbi decoder 1530 and/or the RS decoder 1550 receive accurate values of the SRS from the controller 1570 instead of the decoding output.

Figure 16:
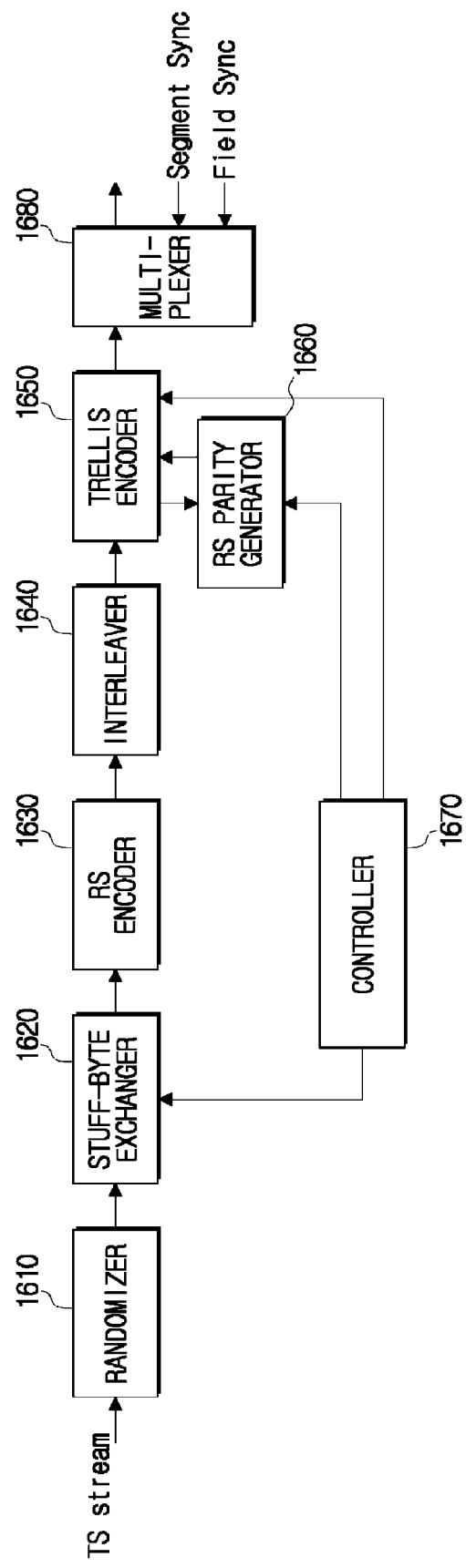
FIG. 16 is a block diagram illustrating the construction of a digital broadcast transmitter according to another embodiment of the present invention.

FIG. 16 is a block diagram illustrating the construction of a digital broadcast transmitter according to another embodiment of the present invention. The transmitter of FIG. 16 is a system that uses the linear code characteristic of an RS encoder. An RS parity generator 1660 uses only initialization symbols as its input. With respect to 187 bytes except for the initialization symbols, the RS parity generator 1660 considers them as inputs of "0", and outputs a parity. Specifically and referring to FIG. 16, the digital broadcast transmitter further includes a randomizer 1610, a stuff-byte exchanger 1620, an RS encoder 1630, an interleaver 1640, a trellis encoder 1650, a multiplexer 1670, and a controller 1680. The randomizer 1610 randomizes an input MPEG-2 transport steam data in order to heighten the utility of an allocated channel space. The data input to the randomizer 1610 has the data format formed by inserting stuff bytes, which have a specified length of bytes, but does not include payload data as shown in FIGS. 5a to 5e, into a specified position of the input transport stream data.

The stuff-byte exchanger 1620 generates known data that is a specified sequence having a specified pattern prearranged between a transmitter side and a receiver side. The stuff-byte exchanger 1620 replaces the stuff bytes in a stuff-byte position of the randomized data by the known data. The known data can easily be detected from payload data to be transmitted, and thus is used for synchronization and equalization in the receiver side. The RS encoder 1630 adds a parity of specified bytes to the packet into which the known data is inserted by the stuff-byte exchanger 1620 in replacement of the stuff bytes in order to correct errors occurring due to channels.

The interleaver 1640 performs an interleaving of the data packet to which the parity output from the first RS encoder 1630 is added in a specified pattern. The trellis encoder 1650 converts the data output from the interleaver 1640 into data symbols, and performs a symbol mapping of the data symbols through a trellis encoding at the rate of 2/3. Here, the trellis encoder 1650 initializes the value temporarily stored in its own memory device to a "00" state at the start point of the known data, and performs the trellis encoding of the known data. Also, the trellis encoder 1650 outputs a value for initializing the memory to the RS parity generator 1660, receives a new parity generated by the RS parity generator 1660, and replaces the corresponding existing parity by the received new parity.

The RS parity generator 1660 generates a parity by performing an RS encoding of the MPEG-2 packet received from the RS encoder 1630 using the value for initializing the memory received from the trellis encoder 1650, and transmits the generated parity to the trellis encoder 1650. The RS parity generator 1660 uses only initialization symbols as its input. With respect to 187 bytes except for the initialization symbols, the RS parity generator 1650 considers them as inputs of "0", and outputs the parity.

The controller 1680 transmits position information of the stuff bytes and the known data to be replaced in the corresponding position to the stuff-byte exchanger 1620. Also, the controller 1680 transmits the position information of an initialization packet that includes a part used for the initialization among the packet of 187 bytes input to the RS parity generator 1660 to the RS generator 1660, so that only the initialization packet can be used. For convenience in design, under the assumption that 27 or 26 stuff bytes are used even if the stuff bytes the number of which is smaller than 27 are used, 33 or 32 corresponding initialization packets can be used as an input of the RS parity generator 1660.

Also, the controller 1680 outputs signals for indicating the initialization area and parity area to be replaced to the trellis encoder 1650. The trellis encoder 1650 performs a memory initialization using these signals, receives the parity generated by the RS parity generation unit 1660, and replaces the existing parity by the received parity. The multiplexer 670 inserts a segment sync signal into the data converted into the symbols by the trellis encoder 1650 in the unit of a segment, and inserts a field sync signal into the data in the unit of a field as the data format of FIG. 2. A modulator and RF converter (not illustrated) performs a VSB modulation of a signal into which a pilot signal has been inserted by performing a pulse shaping of the signal, carrying the pulse-shaped signal on an intermediate frequency (IF) carrier, and modulating the amplitude of the signal, performs an RF conversion and amplification of the modulated signal, and transmits an amplified RF-converted signal through a channel allocated with a specified band.

Figure 17:
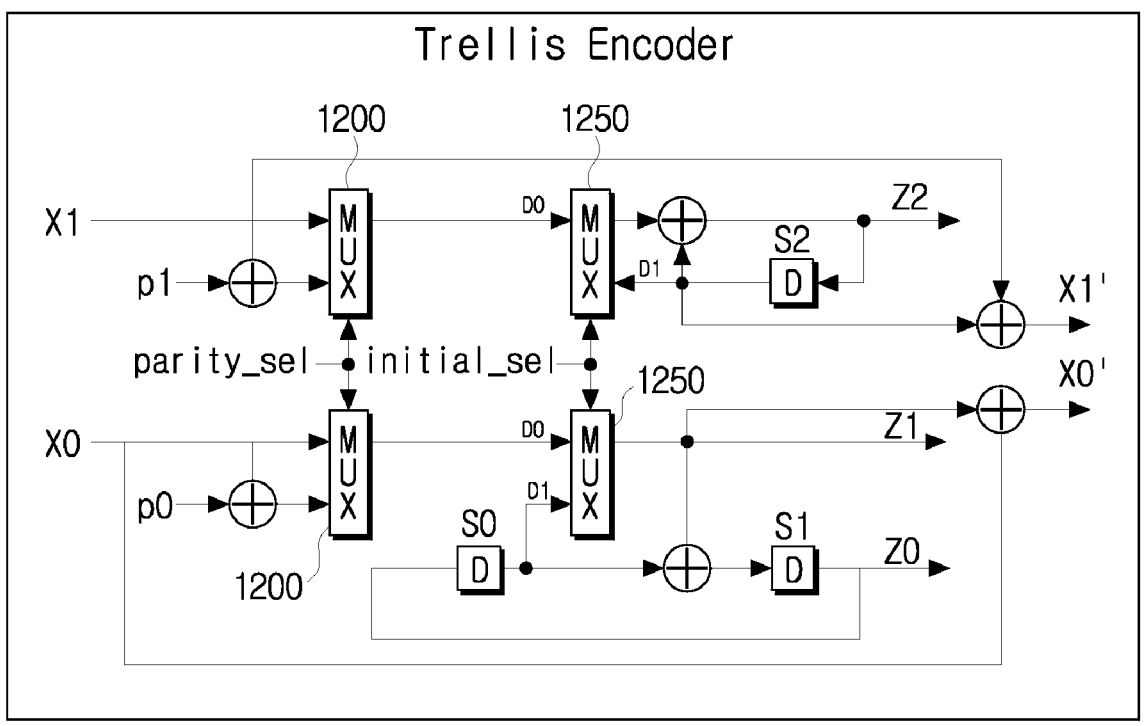
FIG. 17 is a view illustrating the construction of a trellis encoder used in the transmitter of FIG. 16 according to an aspect of the invention.

FIG. 17 is a view illustrating the construction of a trellis encoder 1650 used to perform the above-described operation. The trellis encoder 1650 performs an exclusive OR of a new input bit required to initialize the memory and an input bit X0, X1 used as the original input in the initialization area, and sends the result X1', X0' of the exclusive OR to an RS parity generator 1660. The RS parity generator 1660 generates a parity using this value only, and performs an exclusive OR of the generated parity and the parity input as the original input to be replaced by the generated parity to use the resultant value of the exclusive OR. Accordingly, the same parity as the parity used to replace the parity changed according to the initialization is input, and the same operation is performed.

As shown, new RS parity from the RS re-encoder p0, p1 and the input bits X0, X1 are input to the corresponding multiplexers 1200. An exclusive OR operation is performed on the corresponding new RS parity p0, p1 prior to being received at the corresponding multiplexers 1200. According to the initial select and the parity selection, the multiplexers 1200 output D0s to corresponding multiplexers 1250.

For the output of the multiplexer 1250 corresponding to the parity p1 and input bit X1, an exclusive OR operation is performed with respect to an output D1 of memory S2. The output D1 is further input to the multiplexer 1250. The result of the exclusive OR operation is a mapping output Z2 for use with a corresponding TCM. The mapping value Z2 is also stored in the memory S2 as the next value for output D1. An exclusive OR operation is performed with respect to the output D1 and the parity p1, and the result is output as new input X1' used for the memory initialization to the RS parity generator 660.

The output of the multiplexer 1250 corresponding to the parity p0 and input bit X0 is a mapping value Z1 for use with a corresponding TCM. An exclusive OR operation is performed with respect to input bit X0 and the mapping value Z1, and the output is the new input X0' used for the memory initialization to the RS parity generator 660. An exclusive OR operation is further performed on the mapping value Z1 with respect to an output D1 from a memory S0, and the result of the exclusive OR operation is stored in memory S1 to be output as mapping output Z0 for use with a corresponding TCM. The mapping output Z0 is stored in the memory S0 as the next value for output D1. The output D1 is further input to the multiplexer 1250 with the output D0.

Figure 18:
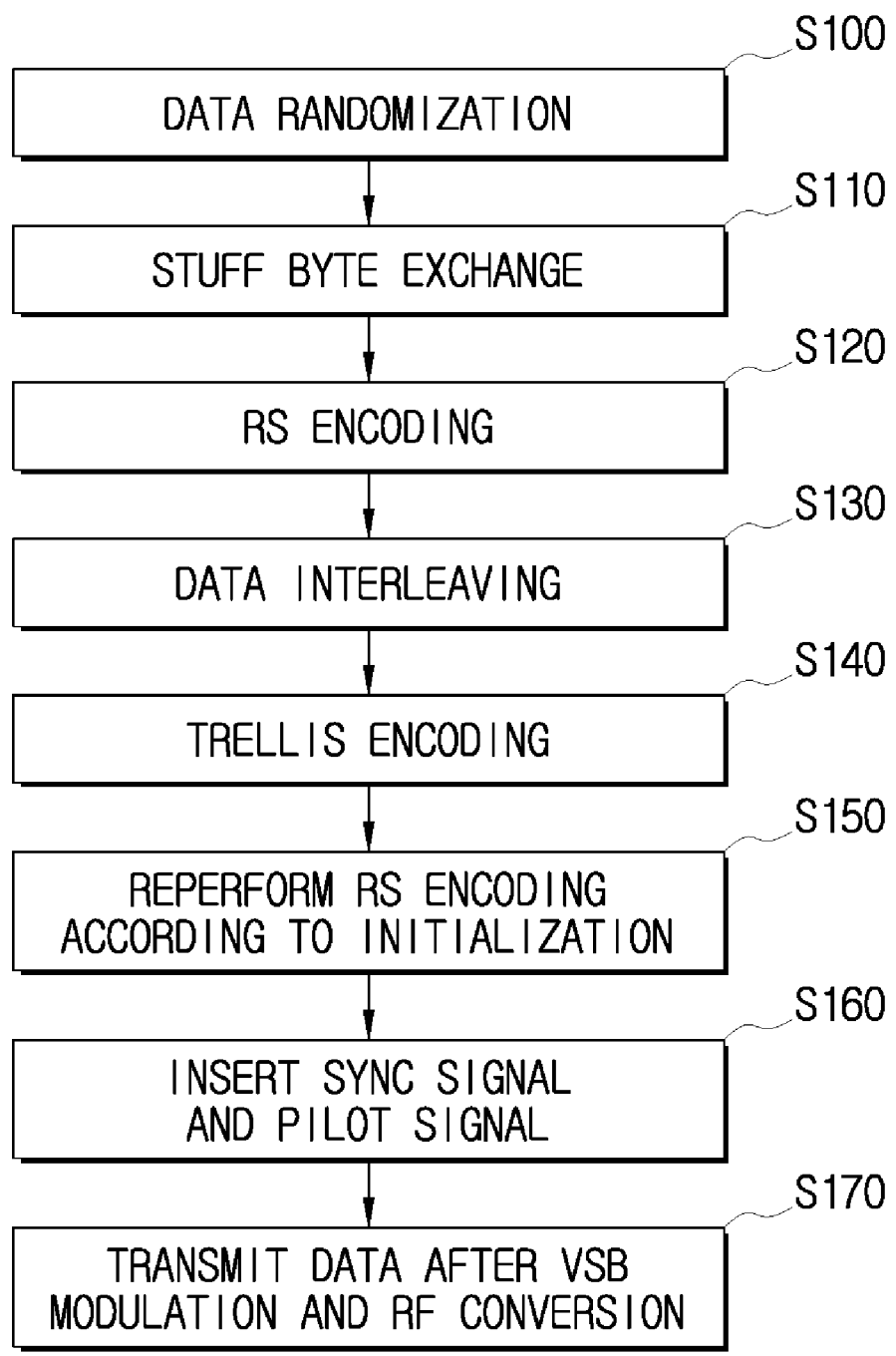
FIG. 18 is a flowchart provided to explain the operation of a digital broadcast transmitter according to an embodiment of the present invention.

FIG. 18 is a flowchart provided to explain the operation of a digital broadcast transmitter according to an embodiment of the present invention. The randomizer 610 receives and randomizes an input transport steam (S100). The stuff-byte exchanger 620 inserts the known data into a stuff region included in the transport stream randomized by the randomizer 610, under the control of the controller 680 (S110).

When the transport stream into which the known data has been inserted is input, the encoder 630 performs an RS encoding for adding a parity to the parity area included in the transport stream packet (S120). The interleaver 640 performs an interleaving of the data packet, to which the parity output from the RS encoder 620 is added, in a specified pattern (S130). The trellis encoder 650 initializes the value temporarily stored in its own memory device at a start point of the known data, and performs a trellis encoding of the known data (S140).

The RS parity generator 660 generates a parity by performing an RS encoding of the MPEG-2 packet received from the RS encoder 630 using the value for initializing the memory received from the trellis encoder 650, and transmits the generated parity to the trellis encoder (S150). The multiplexer 670 inserts a segment sync signal into the data converted into the symbols by the trellis encoder 650 in the unit of a segment and inserts a field sync signal into the data in the unit of a field as the data format of FIG. 2 (S160).

The modulator and RF converter (not illustrated) performs a VSB modulation of a signal into which a pilot signal has been inserted by performing a pulse shaping of the signal, carrying the pulse-shaped signal on an intermediate frequency (IF) carrier, and modulating the amplitude of the signal, performs an RF conversion and amplification of the modulated signal, and transmits the amplified RF-converted signal through a channel allocated with a specified band (S170).

FIG. 19 is a flowchart provided to explain the operation of a digital broadcast receiver according to an embodiment of the present invention. The tuner (not illustrated) converts an RF signal received through a channel into a baseband signal, and the demodulator 1510 performs a sync detection and demodulation of the converted baseband signal (S200). The equalizer 1520 performs the equalization by compensating for the channel distortion of the demodulated signal and removing the interference between the received symbols (S210).

The Viterbi decoder 1530 error-corrects and decodes the equalized signal (S220). The deinterleaver 1540 rearranges the data dispersed by the interleaver of the transmitter (S230). The deinterleaved data is error-corrected through the RS decoder 1550 (S240), and the error-corrected data is derandomized through the derandomizer 1560, so that the data of the MPEG-2 transport stream is restored (S250).

As described above, according to an aspect of the present invention, the receiving performance of the digital broadcast receiver such as the synchronization and the equalization can be improved even in an inferior multi-path channel by generating and inserting the stuff bytes into the MPEG-2 transport stream, and transmitting the transport stream into which the known data is inserted in replacement of the stuff bytes in the digital broadcast transmitter, and by detecting the known data from the received signal and using the known data for the synchronization and the equalization in the digital broadcast receiver.

According to an aspect of the present invention, the operation performance of the equalizer can be improved through the proper adjustment of the amount and the pattern of the sequence of the known data inserted into the transport stream, and thus the receiving performance of the digital broadcast receiver can be improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A digital broadcast transmitter, comprising:
    a Trellis encoder to initialize a memory and provide an initialization byte changed according to the initialization; and
    a Reed-Solomon (RS) parity generator to compensate a parity according to the initialization byte which is changed by the initialization,
    wherein the trellis encoder comprises two of MUXes, three of internal memories, and two of adders, each of the MUXes receives a stored value from two of internal memories among the three of internal memories, separately,
    wherein the three of internal memories are initialized when values of an initialization region in a stream are input to the two of MUXes, and the stream is changed according to the initialization of the three of internal memories, and
    wherein 2 symbols, that is, 4 bits, of 4 symbols derived from initialization bytes are used for trellis initialization of the Trellis encoder, and last 2 symbols, that is, 4 bits, derived from the initialization bytes are not used for the trellis initialization and are treated as symbols from a known data byte.

2. The digital broadcast transmitter as claimed in claim 1, further comprising:
    a symbol mapper to perform symbol mapping of a value output by the RS parity generator.

3. The digital broadcast transmitter as claimed in claim 1, wherein the Trellis encoder performs trellis encoding of a value output by the RS parity generator.

4. The digital broadcast transmitter as claimed in claim 3, wherein the trellis encoder comprises:
    a first memory;
    a first multiplexer (MUX) to output one of an input signal and a value retrieved from the first memory according to a control signal;
    a first adder to add the value stored in the first memory and the one of the input signal and the value retrieved from the first memory output by the first MUX;
    a second memory;
    a third memory to store a value shifted from the second memory;
    a second MUX to output one of another input signal and a value stored in the third memory according to the control signal; and
    a second adder to add the value stored in the third memory and the one of the another input signal and the value stored in the third memory output by the second MUX and to provide the added value to be stored in the second memory.

5. The digital broadcast transmitter as claimed in claim 3, further comprising:
    an interleaver to interleave the stream and provide the trellis encoder with the interleaved stream.

6. The digital broadcast transmitter as claimed in claim 5, wherein the interleaver receives the stream having a structure in which an initialization byte is arranged in a first direction, and performs interleaving of the received stream so that the initialization byte is arranged in a second direction perpendicular to the first direction.

7. The digital broadcast transmitter as claimed in claim 6, wherein the first direction is a direction vertical to a stream structure of the stream, and the second direction is a direction horizontal to the stream structure.

8. The digital broadcast transmitter as claimed in claim 1, further comprising:
    a symbol-to-byte converter to convert an initialization symbol in the stream to the initialization byte;
    a deinterleaver to deinterleave a value output by the symbol-to-byte converter and to provide a packet buffer with the deinterleaved value;
    an interleaver to interleave a value output by an RS encoder; and
    a byte-to-symbol converter to convert a value output by the interleaver to a symbol.

9. A digital broadcast system, comprising:
    a digital broadcast transmitter to initialize an internal memory, provide an initialization byte changed according to the initialization, and compensate a parity according to the initialization byte which is changed by the initialization; and
    a digital broadcast receiver to receive and process a stream output by the digital broadcast transmitter,
    wherein the digital broadcast transmitter comprises a Trellis encoder for initializing an internal memory and providing an initialization byte changed according to the initialization,
    wherein the trellis encoder comprises two of MUXes, three of internal memories, and two of adders, each of the MUXes receives a stored value from two of internal memories among the three of internal memories, separately,
    wherein the three of internal memories are initialized when values of an initialization region in the stream are input to the two of MUXes, and the stream is changed according to the initialization of the three of internal memories, and
    wherein 2 symbols, that is, 4 bits, of 4 symbols derived from initialization bytes are used for trellis initialization of the Trellis encoder, and last 2 symbols, that is, 4 bits, derived from the initialization bytes are not used for the trellis initialization and are treated as symbols from a known data byte.

10. The digital broadcast system as claimed in claim 9, wherein the digital broadcast transmitter comprises a symbol mapper to perform symbol mapping of a value output by a Reed-Solomon (RS) parity generator.

11. The digital broadcast system as claimed in claim 9, wherein the digital broadcast transmitter comprises:
- an RS parity generator to compensate a parity according to the initialization byte which is changed by the initialization; and
- a trellis encoder to perform trellis encoding of a value output by an RS encoder.

12. The digital broadcast system as claimed in claim 11, wherein the trellis encoder comprises:
- a first memory;
- a first multiplexer (MUX) to output one of an input signal and a value retrieved from the first memory according to a control signal;
- a first adder to add the value stored in the first memory and the one of the input signal and the value retrieved from the first memory output by the first MUX;
- a second memory;
- a third memory to store a value shifted from the second memory;
- a second MUX to output one of another input signal and a value stored in the third memory according to the control signal; and
- a second adder to add the value stored in the third memory and the one of the another input signal and the value stored in the third memory output by the second MUX, and to store the added value in the second memory.

13. The digital broadcast system as claimed in claim 11, wherein the digital broadcast transmitter further comprises:
- an interleaver to receive the stream having a structure in which the initialization byte is arranged in a first direction, perform interleaving of the stream so that the initialization byte is arranged in a second direction perpendicular to the first direction, and provide the trellis encoder with the interleaved stream.

14. A digital broadcast system, comprising:
- a digital broadcast transmitter to convert an initialization symbol in a stream to a byte, initialize an internal memory, provide an initialization byte changed according to the initialization, and compensate a parity according to the initialization byte which is changed by the initialization; and
- a digital broadcast receiver to receive and process the stream output by the digital broadcast transmitter,
- wherein the digital broadcast transmitter comprises a Trellis encoder for initializing an internal memory and providing an initialization byte changed according to the initialization,
- wherein the trellis encoder comprises two of MUXes, three of internal memories, and two of adders, each of the MUXes receives a stored value from two of internal memories among the three of internal memories, separately,
- wherein the three of internal memories are initialized when values of an initialization region in the stream are input to the two of MUXes, and the stream is changed according to the initialization of the three of internal memories, and
- wherein the digital broadcast transmitter further comprises:
- a deinterleaver to deinterleave a value output by a symbol-to-byte converter and provide a packet buffer with the deinterleaved value, the packet buffer storing the stream including the initialization byte and replacing at least one part of the initialization byte with the new value;
- an interleaver to interleave a value output by an RS encoder which performs RS encoding of the one part replaced with the new value in the packet buffer so as to correct a parity; and
- a byte-to-symbol converter to convert a value output by the interleaver to a symbol.

15. The digital broadcast transmitter as claimed in claim 1, wherein the Trellis encoder performs Trellis encoding on a parity output from the RS parity generator.

16. The digital broadcast transmitter as claimed in claim 1, wherein:
- the parity is generated by a first RS encoding of the stream; and
- the Trellis encoder receives a replacement parity that is generated by the RS parity generator to compensate the parity generated by the first RS encoding, and replaces the parity with the replacement parity.

* * * * *